United States Patent [19]

Davis et al.

[11] Patent Number: 4,922,408

[45] Date of Patent: May 1, 1990

[54] APPARATUS FOR MULTI-PROCESSOR COMMUNICATIONS

[75] Inventors: Alan L. Davis; Shane V. Robison, both of Half Moon Bay; Kenneth S. Stevens, Union City, all of Calif.

[73] Assignee: Schlumberger Technology Corporation, San Jose, Calif.

[21] Appl. No.: 195,465

[22] Filed: May 12, 1988

Related U.S. Application Data

[63] Continuation of Ser. No. 781,265, Sep. 27, 1985, abandoned.

[51] Int. Cl.$^5$ .............................................. G06F 15/16
[52] U.S. Cl. ................................. 364/200; 364/229.5
[58] Field of Search ... 364/200 MS File, 900 MS File; 370/60, 94

[56] References Cited

U.S. PATENT DOCUMENTS

| | | | |
|---|---|---|---|
| 3,308,436 | 3/1967 | Borck et al. | 364/200 |
| 3,772,656 | 11/1973 | Serrachioli | 364/200 |
| 3,805,234 | 4/1974 | Masters | 364/200 |
| 4,270,170 | 5/1981 | Reddaway | 364/200 |
| 4,271,479 | 6/1981 | Cheselka et al. | 364/900 |
| 4,380,046 | 4/1983 | Frosh et al. | 364/200 |
| 4,394,730 | 7/1983 | Suzuki | 364/200 |
| 4,412,285 | 10/1983 | Neches et al. | 364/200 |
| 4,468,777 | 8/1984 | Carrison et al. | 364/200 |
| 4,494,185 | 1/1985 | Gunderson et al. | 364/200 |
| 4,503,501 | 3/1985 | Coulson et al. | 364/200 |
| 4,628,446 | 12/1986 | Hoffiner | 364/900 |

OTHER PUBLICATIONS

Charles L. Seitz, "Concurrent VLSI Architectures", *IEEE Transactions on Computers*, vol. C-33, No. 12, Dec. 1984, pp. 1247-1265.

*Primary Examiner*—David Y. Eng
*Attorney, Agent, or Firm*—McCubbrey, Bartels, Meyer & Ward

[57] ABSTRACT

A communication network formed by a plurality of communication processors which are connected together in hexagonal array is disclosed. The data processing system consists of a plurality of data processors. Each data processor is coupled to a communication processor which is responsible for sending messages to and receiving messages from other communication processors. Each communication processor communicates with the 6 communication processors adjacent to it through 6 ports. When a given data processor wishes to send a message to another data processor, it transfers the message to its communication processor which in turn transfers the message to the communication processor coupled to one of these 6 ports with information specifying the final destination of the message. The message routing algorithm used by each of communication processors automatically reroutes messages around communication bottlenecks created by a malfunctioning communication processor or by a local communication overload.

12 Claims, 14 Drawing Sheets

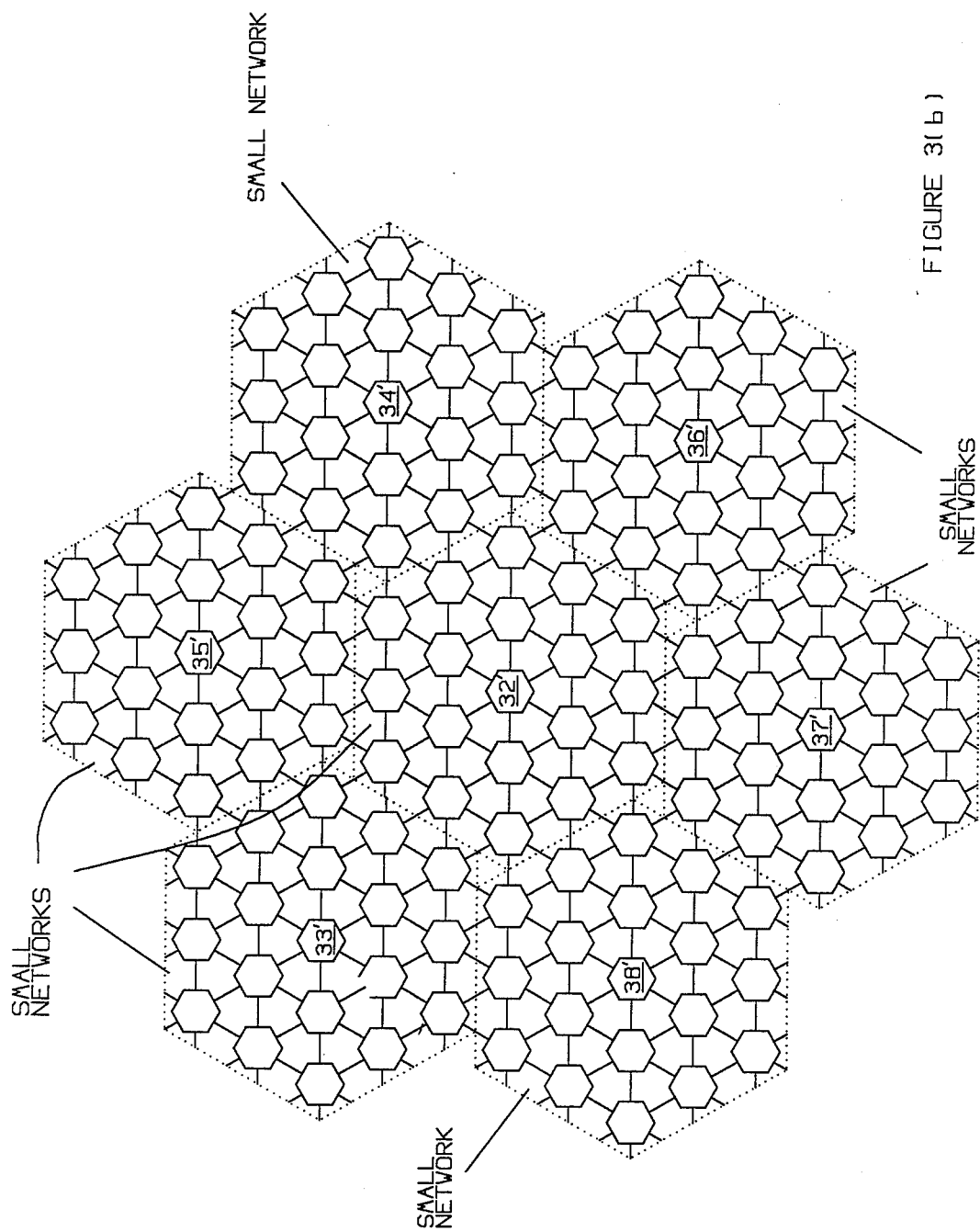

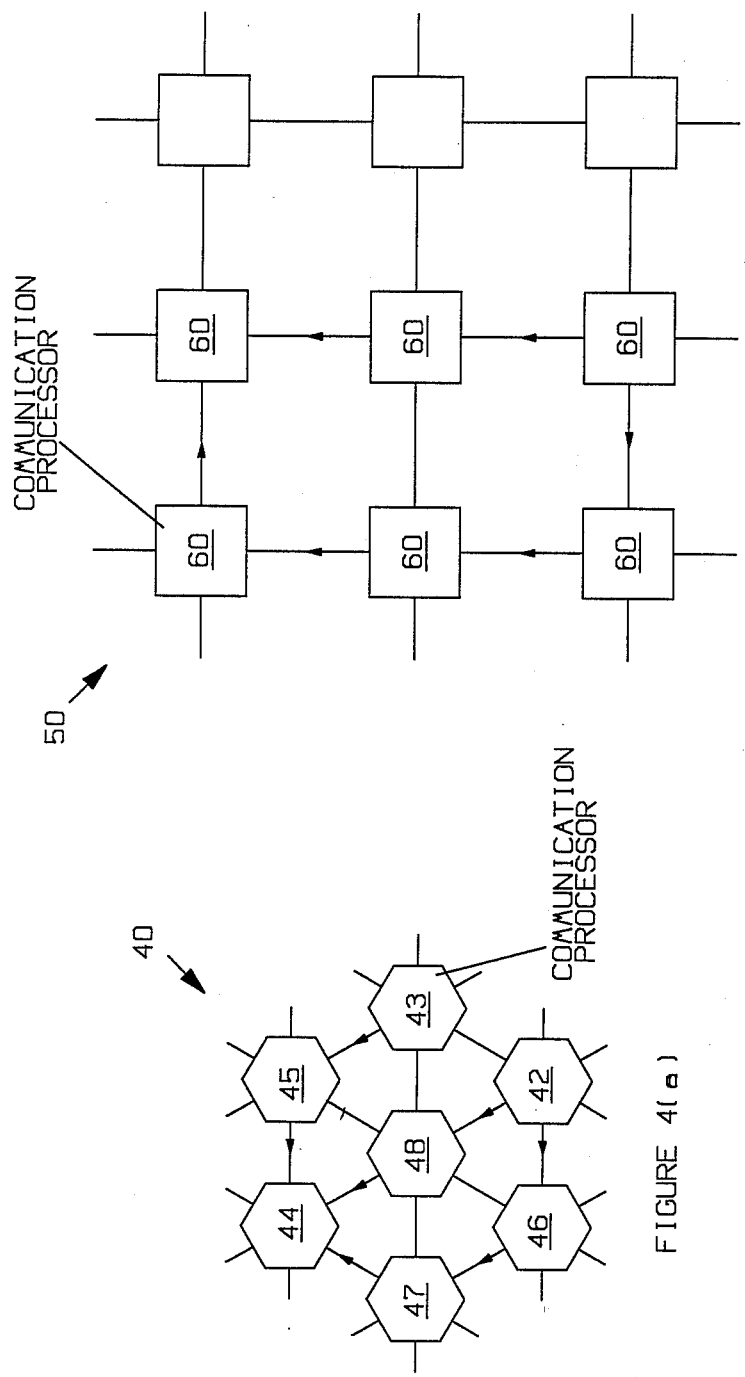

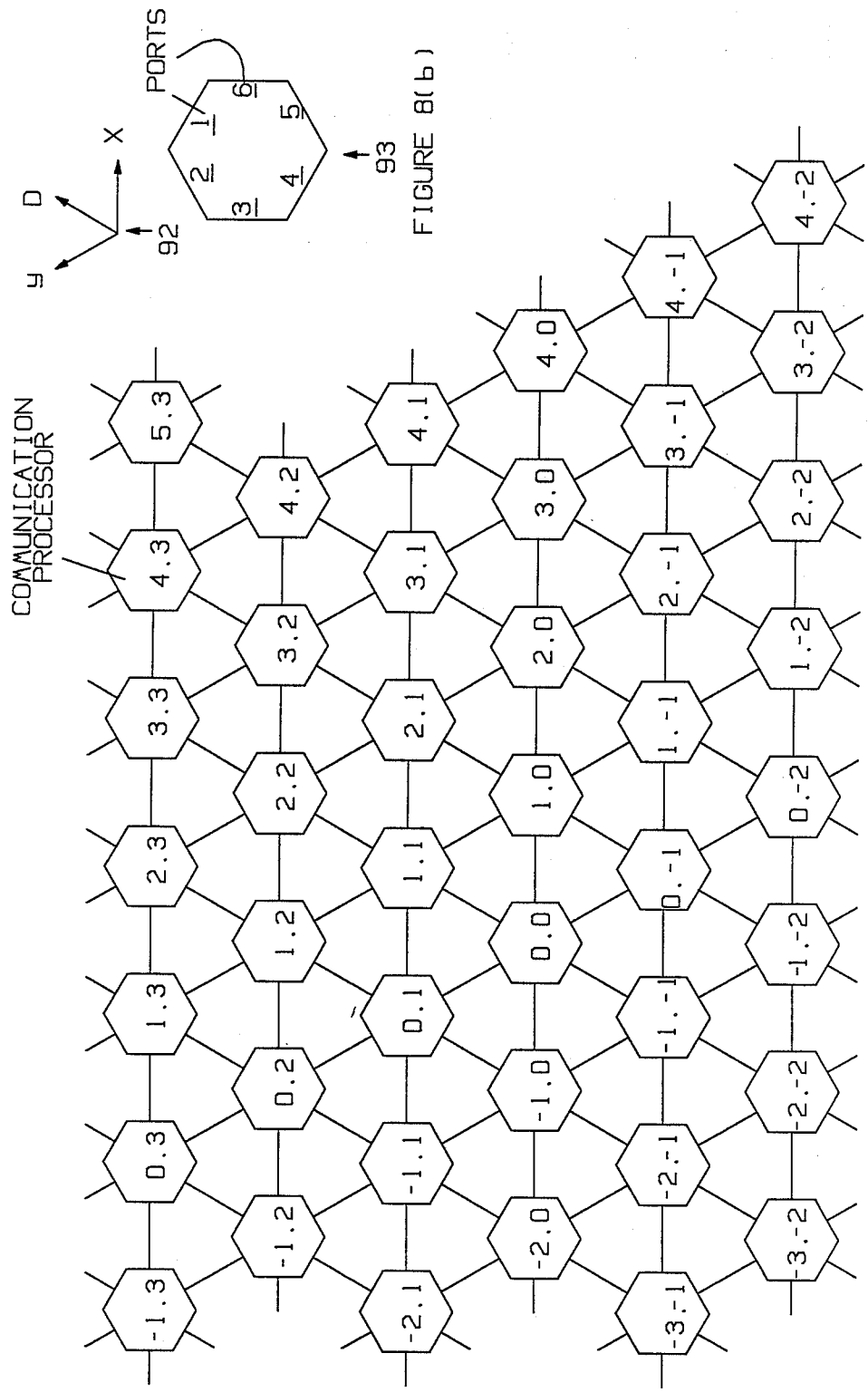

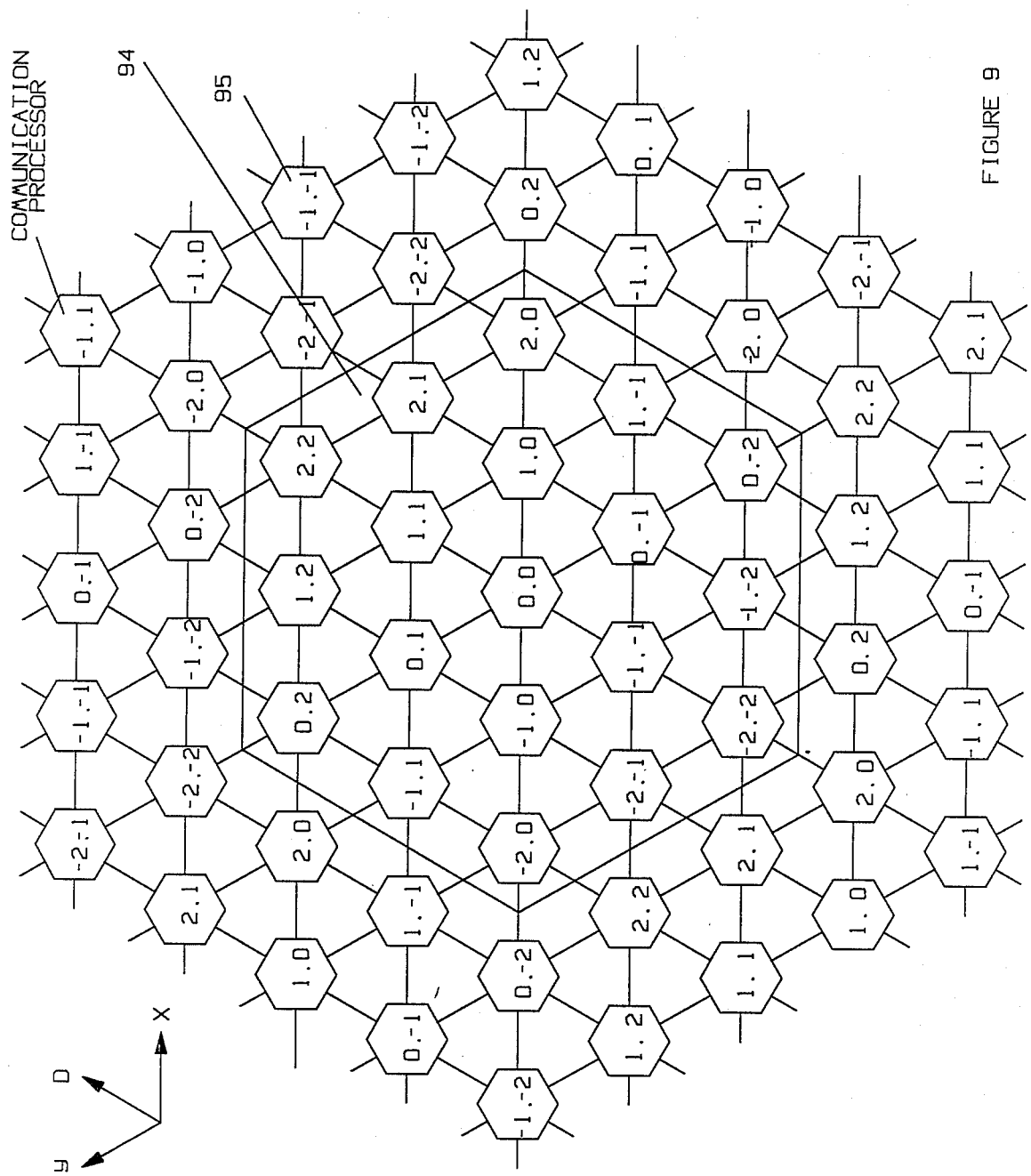

APPARATUS FOR MULTI-PROCESSOR COMMUNICATIONS

This application is a continuation of application Ser. No. 781,265, filed Sept. 27, 1985, now abandoned.

BACKGROUND OF THE INVENTION

The present invention relates to the field of special purpose processing units for use in computer systems and more specifically to communication processors for communicating between individual computers in a multicomputer data processing system.

There have been numerous attempts to improve on the basic Von Neuman computer architecture. The Von Neuman design consists of a central processing unit which is coupled to a memory. The central processing unit is responsible for carrying out the various calculations specified by a program which is stored in the memory. The data used in these calculations is also stored in the memory. The memory consists of a plurality of storage slots, referred to as words. The central processing unit itself has a very small storage capacity. Typically, the central processing unit fetches the next instruction to be executed from the memory, then fetches any data required which is not already in the central processing unit, executes the instruction in question, and stores the result back in the memory. The basic Von Neuman system is limited in speed by the speed of the central processing unit.

One prior art solution to the speed limitations of the basic Von Neuman design involves connecting multiple processing units to the same memory unit. Each of the processing units is connected to a common bus which links the processing units to the memory. Each processing unit runs independently of the others. Some form of bus arbitration is used to resolve conflicts between two processing units which seek to control the bus at the same time for the purpose of accessing the memory. The program to be executed by the system is broken into a number of subprograms, each of which is executed by one of the processing units. The ability to improve the speed of the system through this form of concurrent processing is limited by the need to use a common bus to link the memory to each processing unit. If a given processing unit must have access to the memory for 1 clock cycle to obtain an instruction and data needed to keep it busy for 10 clock cycles, then no more than 10 processing units can be productively connected to the bus. Since the individual processing units have very little internal storage capacity, the ratio of memory access cycles to computational cycles is quite large in this type of system.

One prior art solution to the speed limitations of the above described shared bus system is to provide each processing unit with its own memory. In this design, the various processing units communicate with each other over a separate communication link and with their individual memory units over an internal bus. Again, the program is divided into a number of subprograms which are executed by individual processors. Since the individual processing units include a significant amount of memory, the ratio of time needed to communicate on the communication link to the time spent in computation without such communication is much smaller than in the shared bus system described above. This can be seen from the following example.

Consider a simple program having 98 instructions which requires the use of a single data word stored in memory, and the result of the program is a second data word which must be stored back in the memory. In the exemplary situation where 1000 of such data words are to be processed by this program, the memory must be accessed 100 times every time a word is processed. The data word must be fetched from memory. Then the 98 instructions of the program must be fetched which requires the memory to be accessed 98 more times. Finally, the result must be stored.

In a shared bus system, the number of times memory must be accessed to apply this program to 1000 data words is 100,000. If the processing unit has its own memory, then the communication link need only be used to send the 98 instructions once in addition to the 1000 data words to the processing unit and the 1000 resulting data words back from the processing unit. Hence, the communication link need only be accessed 2098 times for the same computation which required 100,000 accesses in the shared bus system. This allows a larger number of processing units to share the same communication link. However, the number can not be made arbitrarily large, since sooner or later the ability of the communication link to service all the processing units will become limiting.

When the communication link becomes limiting, another level of communication link must be established to form a pyramid-like architecture. Two or more systems of processing units, referred to as clusters, can be combined by providing a "super communication link processor" which is used to communicate tasks to each cluster which in turn communicates the tasks over its internal communication link to the individual processing units. This solution to the communication link overload has several problems. First, the super communication link processor can only handle a few clusters. This can be seen as follows: the super communication link has no greater capacity than one of the individual buses in a cluster, since if it were possible to make a super communication link with a greater capacity, that design could also be used in each cluster. Consider the case in which each processor in a cluster receives its work only through the super communication link. The number of processors in the cluster is chosen such that the cluster bus is working at capacity; that is, it is saturated by the communication tasks needed to receive the work for each processor from the super communication link and to return the results of those tasks through the super communication link. But each piece of this data had to come from the super communication link; hence it also must be saturated by the load needed to service this one cluster. Thus, in this case, the super communication link can service only one cluster. This results from the assumption that each processor in the cluster receives its work only from the super communication link. Hence, for a super communication link to service more than one cluster, each cluster must generate and "consume" most of the communication traffic on its internal bus. This requirement limits the use of such pyramid architectures. The large improvement obtained by including a memory with each processing unit has no analogous improvement at the super communication link processor level. This earlier described improvement was the result of removing the need to repetitively transfer the programs to each processing unit over a common memory bus shared by other processing units. Once each of the individual processing units has sufficient memory to store the program and any data which would be repetitively transferred, no further large improvements in the density of communication on the communication link is possible using this type of pyramid architecture.

A second problem inherent in the pyramided cluster approach is the need to introduce a new type of processor, the super communication link processor, as the system is expanded. VLSI fabrication techniques have greatly improved the cost of highly repetitive functional elements such as those used to construct the individual processing units and memories within a cluster. However, the cost of low volume parts used in the super communication link processor can be quite high. The additional level of complexity also leads to an additional level of complexity in the software needed to drive the system. The software must now manage the division of the problem being solved into large pieces to be sent to each cluster as well as into smaller pieces which are to be allocated to each processing unit within a cluster.

Third, each super communication link processor is a potential communication bottleneck. Consider a situation in which two clusters attached to the same super communication link processor must exchange a large volume of information, referred to as messages. This exchange can occupy so much super communication link processor time that there is no time remaining for transmitting messages between other clusters attached to that super communication link processor. This can result in the other clusters running out of work and standing idle, which reduces the system throughput. To avoid this type of problem, a means of rerouting messages through alternate super communication link processors which are not saturated is needed. It is difficult to construct a convenient structure for providing such alternate routing in this type of pyramid architecture.

Finally, this type of pyramid structure is not sufficiently fault tolerant. As the number of processing units in a system is increased, the probability that one processing unit must be placed off-line due to malfunction increases. If the processing unit in question is a super communication link processor, all of the clusters it serviced must also be taken out of service.

Consequently, it is an object of the present invention to provide an improved communication processor and architecture for communicating between processing units in a multiprocessor system.

It is a further object of the present invention to provide a communication processor and communication architecture which may be used to construct multiproceessor systems of arbitrarily large size without the addition of new communication components.

It is a still further object of the present invention to provide a communication network which automatically routes messages around bottlenecks.

It is yet another object of the present invention to provide a communication processor which is fault tolerant.

These and other objects of the present invention will become apparent from the following detailed description of the present invention and the accompanying drawings.

SUMMARY OF THE INVENTION

The present invention consists of a communication network formed by a plurality of communication processors which are connected together in such a way that messages can be sent efficiently between any two processors in a multiprocessor data processing system. The data processing system consists of a plurality of data processors which are preferably identical. Each data processor is coupled to a communication processor which is responsible for sending and receiving messages between itself and other communication processors which are coupled to other data processors. The communication processors are organized into a two dimensional hexagonal array. Each communication processor communicates with the 6 communication processors adjacent to it through 6 ports. Each such port couples the communication processor in question to a corresponding port in one of the 6 communication processors adjacent to it.

When a given data processor wishes to send a message to another data processor in the multiprocessor system, it places that message in its memory and then signals the communication processor coupled to it. The communication processor has access to the data processor's memory. The signal indicating that a message is ready to send includes the necessary information for the communication processor to locate the message in question in the data processor's memory. Once this signal is given, the data processor is free to continue its other computations. Thus the communication processor relieves the data processor of essentially all of the overhead involved in communicating with other data processors in the multiprocessor system.

The communication processor sends the message through the appropriate port to an adjacent communication processor. If the final destination of the message is the data processor coupled to the adjacent communication processor, that communication processor will cause the message to be stored in said data processor's memory. If the destination is not the data processor coupled to the adjacent communication processor to which the message was sent, the adjacent communication processor will relay the message to a third communication processor which is adjacent to it. The message will be so relayed until it reaches the communication processor coupled to the data processor which is its final destination.

The message routing algorithm used by each of communication processors automatically reroutes messages around communication bottlenecks created by a malfunctioning communication processor or by a local communication overload. If a message is to be sent to a communication processor and the most efficient route for sending that message is not available because of a local communication overload, the message will be automatically rerouted.

The communication processors on the edge of the hexagonal array do not have a port of an "adjacent" communication processor coupled to each of their ports. The ports which lack such a coupling are connected to a routing switch which allows these ports to be coupled either to the corresponding ports of a communication processor on the opposite edge of the hexagonal array by an external signal path or to an external device or processor. This coupling to the opposite edge of the hexagonal array reduces the transmission time for messages having destinations which are far from the data processor in which the message originates. It may be shown that this external signal path system provides the shortest path length for transmitting messages in the hexagonal array. These edge ports also provide a means for communication with the world outside the multiprocessor system analogous to an input-output port on a conventional computer.

BRIEF DESCRIPTION OF THE DRAWINGS

FIG. 3(b) shows an alternate configuration for the larger communication network shown in FIG. 3(a).

FIG. 4(a) illustrates the routing of a message between non-adjacent communication processors in a communication network based on a hexagonal array.

FIG. 4(b) illustrates the routing of a message between non-adjacent communication processors in a communication network based on a square array.

FIG. 8(a) and FIG. 8(b) illustrate a coordinate system for locating a given communication processor in an infinite hexagonal array.

FIG. 9 illustrates an adaptation of the coordinate system shown in FIG. 8(a) a hexagonal array having three communication processors on each side of said array.

DETAILED DESCRIPTION OF THE INVENTION

Figure 1:
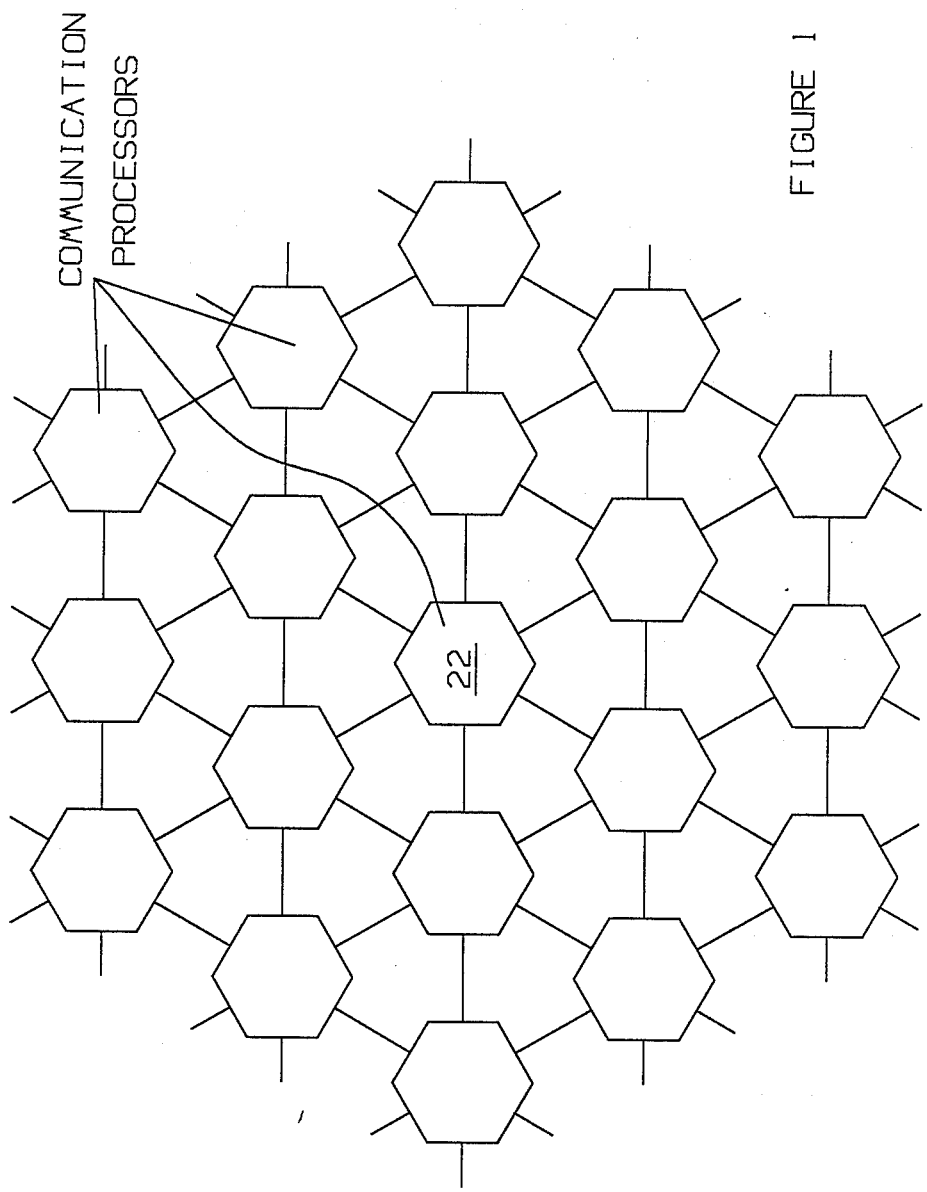
FIG. 1 illustrates a communication network according to the present invention.

The present invention consists of a communication network for transmitting messages between data processors in a multiprocessor data processing system. Each data processor is connected to a communication processor which communicates with other communication processors in the network. It will be apparent to those skilled in the art that each of the data processors may be replaced by a cluster of data processors consisting of two or more processing units coupled to a memory. A communication network having nineteen communication processors according to the present invention is illustrated in FIG. 1. For clarity, the data processor or processors connected to each communication processor is not shown. The communication network consists of a hexagonal array of 20 communication processors of which communication processor 22 is typical. Larger communication networks can be constructed by employing hexagonal arrays which have larger numbers of communication processors on each side.

Figure 2:
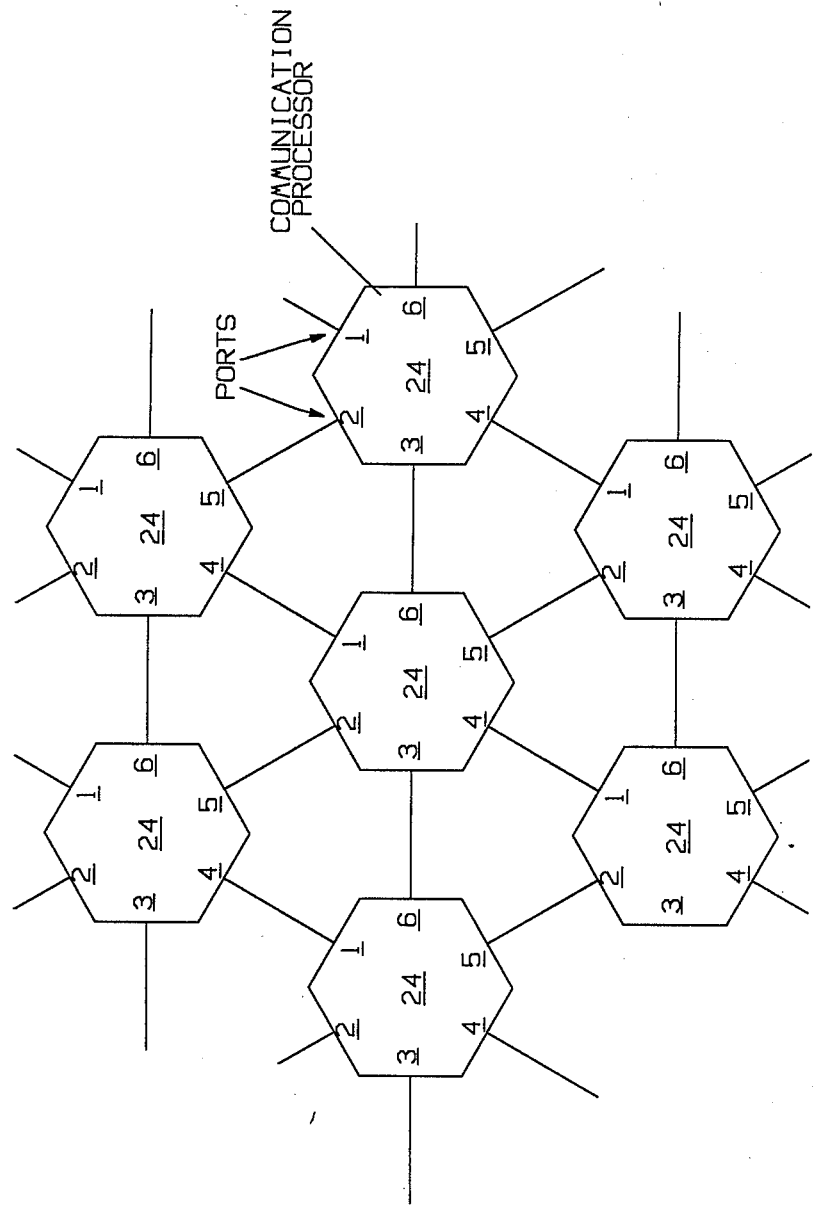
FIG. 2 is a detailed view of the couplings between corresponding ports on adjacent communication processors.

Each communication processor is represented by a hexagon because it has 6 ports for communicating with neighboring communication processors. A message may be either sent or received over any of these ports. This is shown in detail in FIG. 2. The ports 24 in each communication processor are numbered from 1 to 6. Each port 24 is connected to a corresponding port 24 of an adjacent communication processor. Port 1 is connected to port 4 of an adjacent communication processor. Port 2 is connected to port 5 of a different adjacent communication processor. Port 3 is connected to port 6 of yet another adjacent communication processor, and so on. The port connections used for communication processors which are on the edge of the hexagonal array will be described in detail below.

As will be described in more detail below, the communication processor itself is a concurrent processor which is capable of performing several tasks simultaneously. Each of the ports operates independently of other ports. Hence, several messages may be sent or received at one time. In addition, messages be transferred to and from the data processor memory while other messages are being sent and received by the ports.

A message is routed between communication processors by transferring the message to an adjacent communication processor which in turn passes it on to one of its adjacent communication processors, and so on, until the message reaches the communication processor connected to the data processor which is the message's final destination. It should be noted that in the preferred embodiment, the routing algorithm used in this process does not require global information such as a map of the entire communication network to enable the algorithm to route messages. Such information would have to be stored in a table whose size is dictated by the number of communication processors in the communication network. If the number of communication processors in the network is increased, the size of these tables must be increased. This would necessitate hardware modifications in all of the communication processors and is clearly undesirable. As will be described below, the present invention avoids such tables.

According to the present invention, when a data processor wishes to transmit a message to another data processor in the hexagonal array, it transfers that message to its memory together with the destination of the message. It then signals the communication processor connected to it. The communication processor connected to it has access to the data processor's memory. Said communication processor reads the message from the data processor's memory; hence the data processor need take no further actions to effect the transmission of the message. The transmitting communication processor codes the message for transmission and assigns it to one of its ports. If the final destination of the message is a data processor connected to one of the adjacent communication processors, the port connecting the two communication processors is assigned to the message. If the final destination of the message is a more distant data processor, then a port which minimizes the transmission time is chosen in a manner that will be described in detail below.

When a communication processor receives a message on one of its ports, it examines information contained in a message header which specifies the final destination of the message to determine if the message is to be delivered to a data processor connected to said communication processor. This header information is placed in the message by the communication processor which originally sent the message. If said data processor is the final destination, the communication processor stores the message in the memory of the data processor and informs the data processor that a message has arrived. If said data processor is not the final destination of the message, the communication processor retransmits the message as it would a message originating in the data processor connected to it.

Figure 3A:
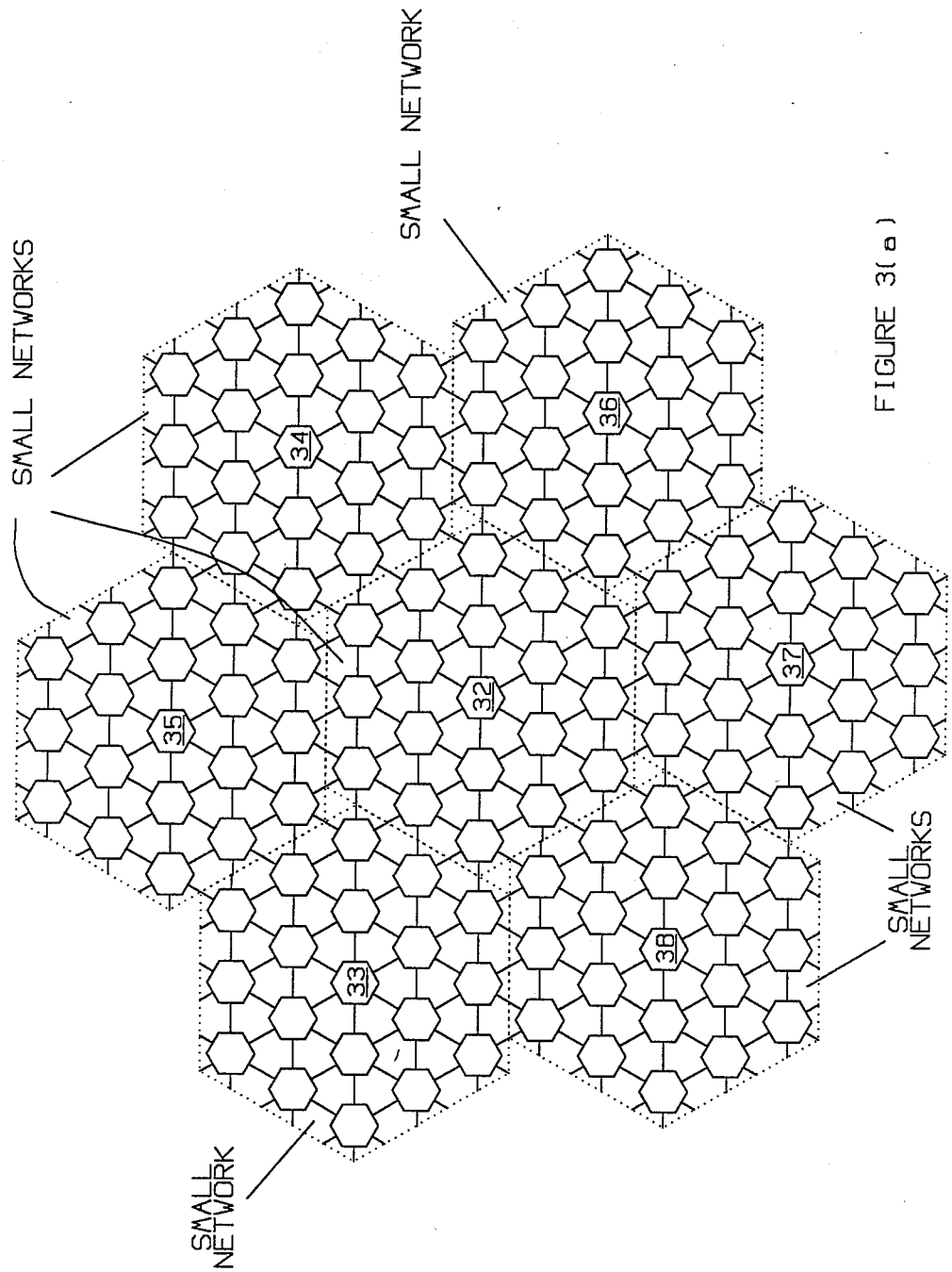
FIG. 3(a) shows a larger communication network constructed from 7 smaller hexagonal communication networks.

This type of hexagonal array communication topology has several advantages over the prior art. Communication networks of arbitrary size may be constructed either by using a single hexagonal array or by combining several hexagonal arrays. FIG. 3(a) illustrates one of the possible larger networks which may be constructed by combining seven smaller hexagonal arrays 32 through 38. Each of these smaller arrays contains nineteen communication processors in this example. The center communication processor of each array has been labeled with the number of the array. For clarity, the boundary of each array is delineated by a broken line. An arbitrary number of such arrays can be combined without the need to introduce any connecting elements into the communication network. Hence, the special purpose communication processors used in prior art systems to combine groups of data processors are eliminated in the present invention.

A second network similar to that shown in FIG. 3(a) is shown in FIG. 3(b). It consists of 7 arrays 32' through 38'. It differs from the network shown in FIG. 3(a) in that array 33' is higher in the diagram than array 34'; whereas in the array shown in FIG. 3(a), array 34 is higher than array 33. The significance of these types of combined arrays will be explained in more detail below.

Since there are no shared buses or communication "hubs" through which a message must pass to get to a particular communication processor, the communication bottlenecks associated with prior art designs are avoided. If a given communication processor is unable to receive a message either because of a malfunction or because it has a backlog of messages which it must transmit, a message can be automatically routed around it as will be described in detail below. It should be noted that as the size of the data processing system is increased by combining hexagonal arrays or by increasing the size of a single hexagonal array, the number of possible communication paths for a given message also increases. Hence, the capacity of the system to reroute messages automatically increases as the message load, which is related to the number of data processors in the system, increases.

The choice of a hexagonal array, as opposed to some other two dimensional array, is dictated by two considerations by the efficiency of fabrication of the multiprocessor data processing system, and the efficiency of message routing around bottlenecks. The preferred embodiment of the data processors is intended for fabrication on a single chip or wafer. The efficiency of utilization of the surface area of said chip or wafer is an important factor, since it determines the number of processors which may be incorporated in the data processing system. A hexagon is the highest order regular polygon which may be used to tile a surface without leaving spaces between the polygons. Hence, a hexagon is the highest order polygon which efficiently utilizes the surface area of the chip. Further, if a higher order polygon were used, the connections between the various communication processors in the array would need to cross, which would complicate the fabrication procedure. Hence, the array must either be hexagonal, pentagonal, square, or triangular. Since there is no preferred direction for message propagation, the processor array should not have a preferred direction. This is equivalent to requiring that, in addition to tiling the entire surface of the chip, the processor array must be symmetrical about two orthogonal axes in the plane containing the communication processor array. Triangular and pentagonal arrays lack this symmetry and hence are not suitable for the communication network.

This reduces the possible choices to hexagonal and square arrays. The selection of a hexagonal array over a square array is dictated by the efficiency of communication around local bottlenecks. This is illustrated in FIG. 4. Referring to FIG. 4(a), a portion of a hexagonal array according to the present invention is shown at 40. Consider a message which originates in communication processor 42 whose final destination is communication processor 44. The optimum route for this message is through communication processor 48. This route requires that the message be transmitted two times, once by communication processor 42 and once by communication processor 48. if communication processor 48 is unable to receive a message because it is overloaded or because it has a malfunction, the message may be sent by either of two alternate paths. The first such path is through communications processors 43 and 45, and the second such path is through communication processors 46 and 47. Each of these alternative paths requires that the message be transmitted three times, i.e., one more time than over the optimum path.

Referring now to FIG. 4(b), an analogous portion of a square array of communication processors is shown at 50. Consider a message which originates in communication processor 52 whose final destination is communication processor 54. The only path over which it may be sent with a delay that is equal to the time needed to transmit it twice is the path through communication processor 56. If communication processor 56 is unable to receive a message because it is overloaded or because it has a malfunction, the message must be routed through communication processors 58, 60, and 62, thereby creating a transmission time equal to the time needed to transmit it four times. Hence, the hexagonal array is superior to the square array in overload and malfunction situations, since the alternate paths to non-adjacent communication processors are shorter.

Figure 5:
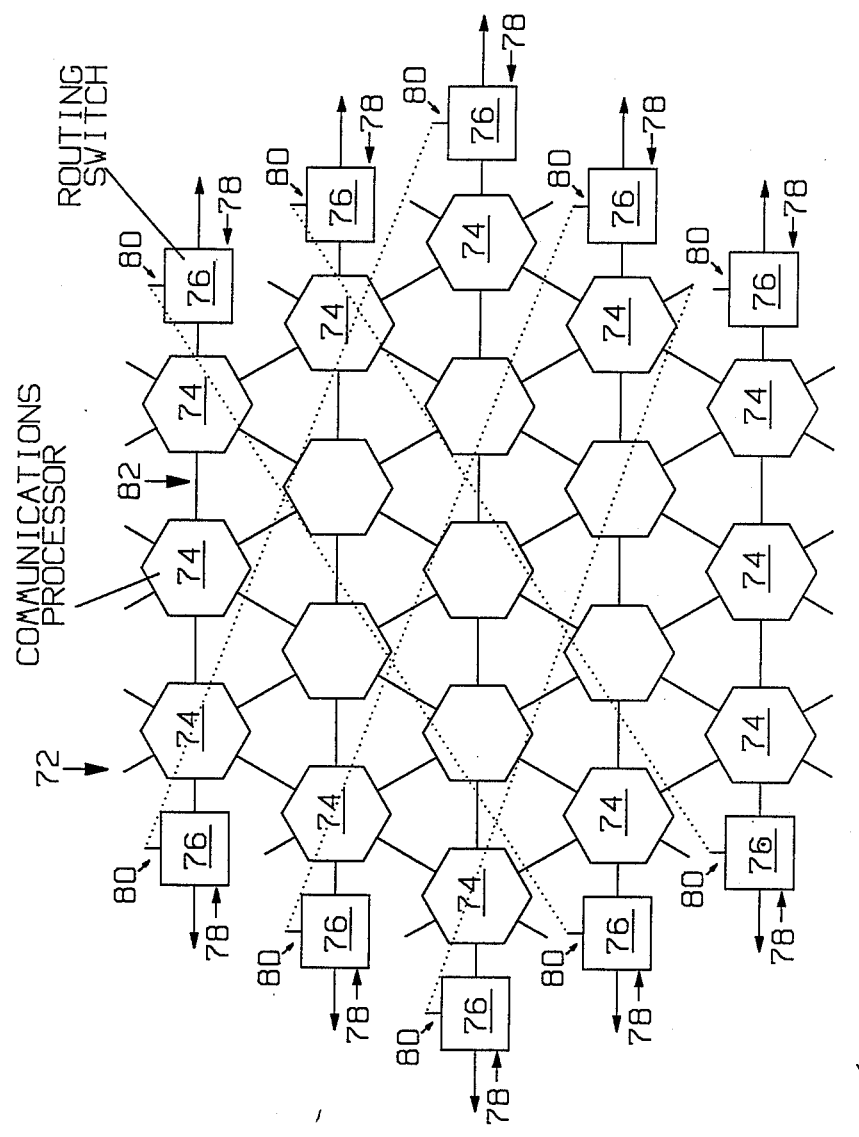
FIG. 5 illustrates the signal path connections used to couple ports on opposite edges of the hexagonal array.

The communication processors which are on the edge of the hexagonal array do not have sufficient adjacent communication processors to couple to each of their ports. For example, in a hexagonal array with three communication processors on a side, the communication processors on the edge have only 3 or 4 adjacent communication processors to which they can be coupled. This is illustrated in FIG. 5 which shows a hexagonal array with nineteen communication processors (three communication processors on a side ) at 70. Each of the communication processors 74 on the edge of the array 70 has two or three ports which are not coupled to an adjacent communication processor. A typical such port is shown at 72. These ports will hereinafter be referred to as peripheral ports. Each peripheral port is connected to a routing switch 76. Each routing switch 76 has two routing ports 78 and 80.

Each of the routing ports 80 is connected to a corresponding routing port 80 on a routing switch 76 on the opposite edge of the hexagonal array by a signal path of which 82 is typical. The signal paths and routing switches 76 connecting the other one or two ports on each of the edge communication processors 74 have been omitted from FIG. 5 for clarity. Thus, a message leaving one of the peripheral ports on an edge communication processor 74 is wrapped around to the opposite edge of the hexagonal array. This reduces the time needed to transmit a message between communication processors which are far apart in the hexagonal array. The choice of which peripheral ports are connected by a given signal path will be described in detail below.

The second routing port 78 on each routing switch 76 is used to couple the hexagonal array to the "outside world". It performs the functions of a conventional input-output port in a conventional data processing system. When an external device wishes to transmit a message to the hexagonal array, it sends said message to the routing switch 76 to which it is connected. This routing switch 76 in turn relays the message to the communication processor 74 to which it is connected.

The routing switches 76 are controlled by data in the header information of each message. Messages which are to be transmitted to the "outside world" are coded with a predetermined header which specifies an internal destination which is recognized by the routing switch 76 receiving the message from an adjacent communication processor 74. Similarly, messages from an external device which are destined for a data processor connected to the hexagonal array are coded with a header identifying the data processor in question. When a switch 76 receives such a message, it routes it to the communication processor connected to it.

The choice of peripheral ports to be connected by a signal path 82 is dictated by two considerations. First, these connections often determine the time needed to transmit a message between two communication processors. It is important that this time be minimized. Second, as will be described in detail below, a proper choice of peripheral port connections results in a communication network in which the communication processors 74 on the edge of the array are indistinguishable from those in the center of the hexagonal array. This increases the efficiency of fabrication of the individual communication processors. In addition, this results in a communication processor that may be used in any size hexagonal array.

Figure 6B:
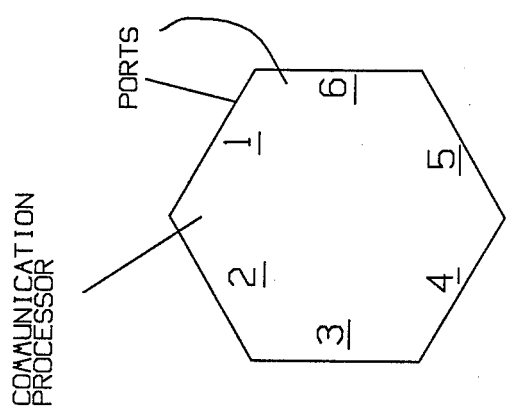
FIG. 6(b) shows the numbering of the ports on each communication processor.

The choice of which peripheral ports are to be interconnected may best be illustrated with reference to a communication network having nineteen communication processors in a hexagonal array with three such communication processors on each edge, as illustrated in FIG. 5. The method of determining the connections may be more easily understood with reference to the diagram shown in FIG. 6(a). This diagram shows a nineteen communication processor communication network 84 connected to six phantom communication networks 86 through 91. Each of the phantom communication networks is a copy of the communication network 84. Each of the communication processors in communication network 84 is labeled with a label from 0a to 18a which identifies its position in the communication network in which it appears. The phantom networks 86–91 are labeled in the same way. As noted above, each communication processor has six ports which are labeled from 1 to 6 as shown in FIG. 6(b). A connection between any two communication processors may be specified by giving the labels of each of the ports which are connected together, and by giving the labels of the communication processors which contain each of the ports in question. For example, in communication network 84, port 6 of communication processor 3a is connected to port 3 of communication processor 2a. Similarly an interconnection between two edge processors in network 84 would be described, for example, as follows. Port 6 of communication processor 9a in communication network 84 is connected to port 3 of communication processor 14a in phantom communication network 86. As described below, this corresponds to signal path 82 shown in FIG. 5.

For each peripheral port in communication network 84, the corresponding peripheral port in communication network 84 to which it is to be connected by a signal path is determined as follows. Find the peripheral port in question in communication network 84 and determine the communication processor and peripheral port to which it is connected in the appropriate phantom communication network 86, 87, 88, 89, 90, or 91. Connect said peripheral port to the peripheral port having the same communication processor and port labels in communication network 84. For example, port 6 of communication processor 9a in communication network 84 is connected to port 3 of communication processor 14a in phantom communication network 86. Therefore, a signal path is created, using routing switches 76, to connect port 6 of communication processor 9a in communication network 84 to port 3 of communication processor 14a in communication network 84. As mentioned above, this is the signal path which is shown at 82 in FIG. 5.

This signal path connection scheme allows each communication processor to "imagine" that it is located in a large array without signal path connections. To decide on the routing of a message to be sent to a specific communication processor, it must only examine the communication processors around it in the large array diagram shown in FIG. 6(a) until it finds the communication processor having a label matching the label of the communication processor to which the message in question is to be sent. It is apparent from an examination of FIG. 6(a), that the communication processor need look no further than two communication processors away in network 84 to find any given label. Hence, this signal path connection scheme allows a message to be transmitted between any two data processors in network 84 with a delay which is at most that needed by the communication network to transmit the message twice. This is clearly the minimum possible delay for a hexagonal array having three communication processors on a side.

Figure 6A:
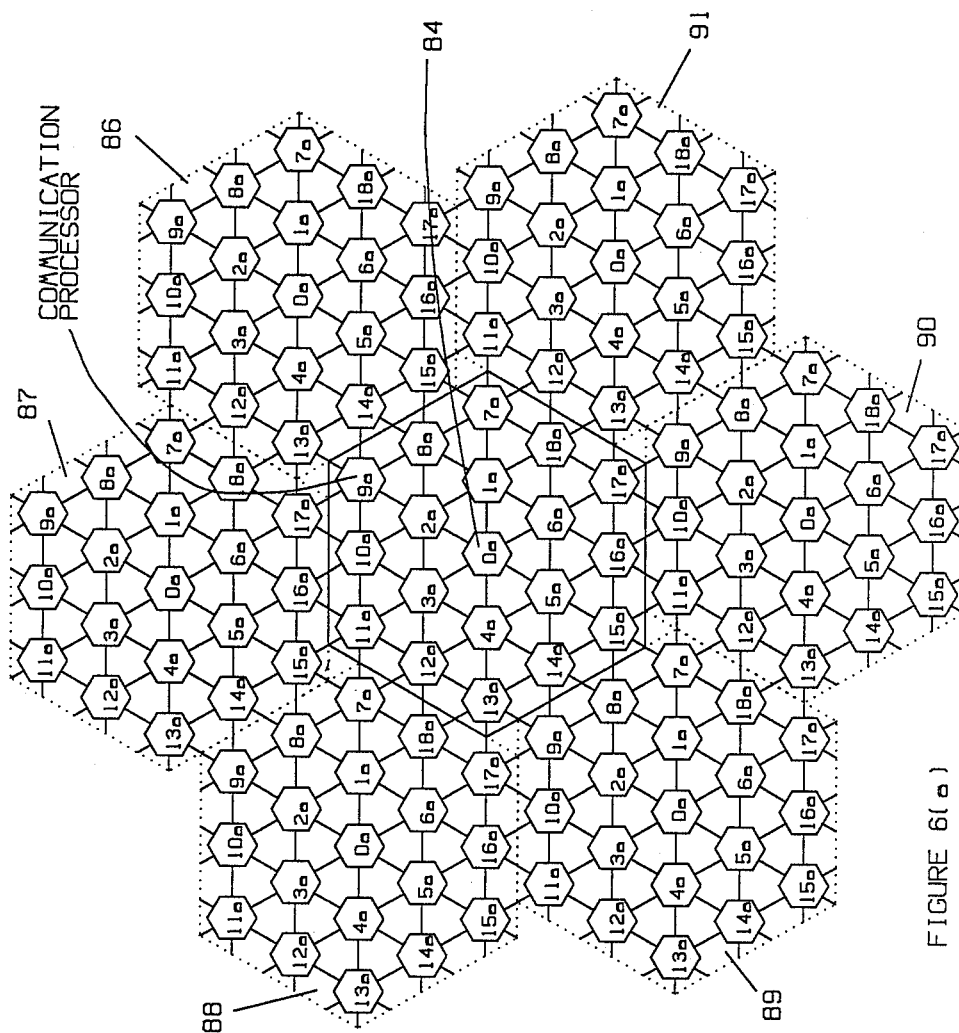
FIG. 6(a) illustrates a method for determining which ports on the edge of the hexagonal array are to be coupled together.
Figure 7B:
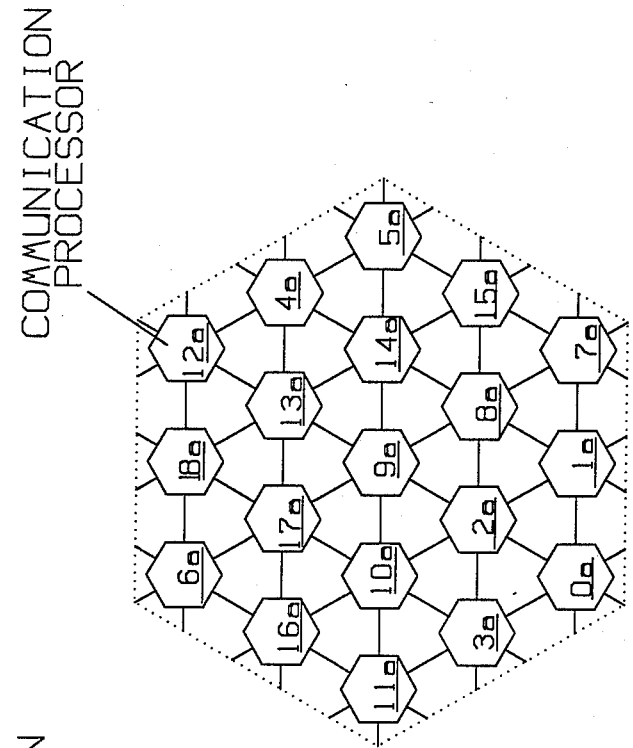
FIGS. 7(a) and (b) each show a routing diagram for communication processors in a hexagonal array having three communication processors on each side of said array.
Figure 7A:
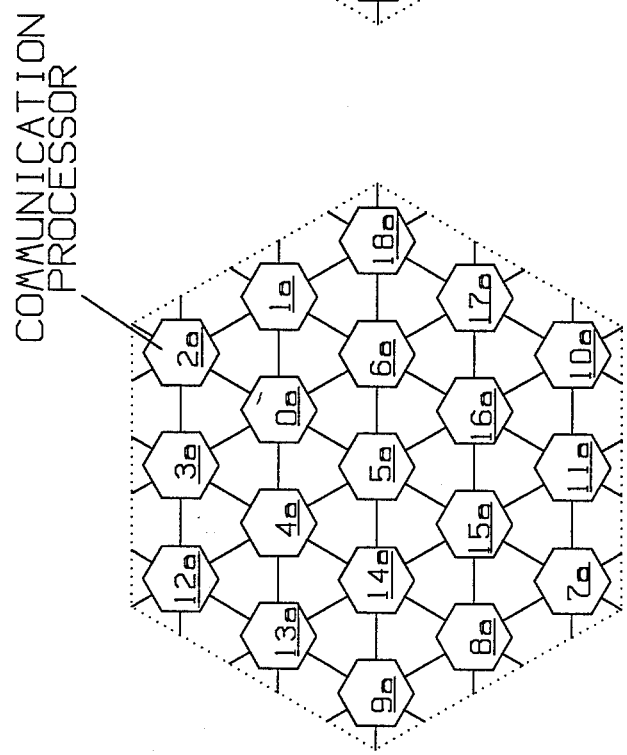

Consequently, a given communication processor must at most store that part of the diagram shown in FIG. 6(a) which shows the locations of each communication processor which is within two communication processors of the communication processor in question. This portion of said diagram, referred to as a routing diagram, is itself a hexagonal array with the communication processor in question at its center. The routing diagrams for communication processors 5a and 9a are shown in FIG. 7(a) and FIG. 7(b), respectively. Each communication processor has the information contained in the relevant routing diagram stored in it. The only thing which distinguishes one communication processor from another in the communication network 84 is the specific routing diagram stored in each communication processor. Thus, both the hardware and software for each communication processor are identical. This greatly simplifies the construction of a communication network according to the present invention. As will be explained in detail below, the routing diagram can be reduced to an algorithm whose storage requirements are independent of the size of the hexagonal array.

The above analysis was performed using a phantom hexagonal array diagram, shown in FIG. 6(a), which was patterned after that shown in FIG. 3(a). As was pointed out above, there is a second possible diagram of this form which was shown in FIG. 3(b). It will be apparent to those skilled in the art of topology that the same result would be obtained if the signal path connections for hexagonal array 84 were determined with respect to a phantom hexagonal array diagram analogous to the diagram shown in FIG. 3(b). The actual peripheral ports which would be connected in this case would be different; however, the only aspect of the present invention which would be changed would be the specific labels of the routing diagram stored in each communication processor.

Finally, the above analysis was performed using a hexagonal array having three communication processors on each edge. The same technique may be applied to an arbitrarily large hexagonal array having E communication processors on a side. A diagram analogous to that shown in FIG. 6(a) can be constructed showing the communication network in question together with six phantom copies of it. The peripheral ports are connected by signal paths which connect each peripheral port to the port of the communication processor on the opposite edge of the hexagonal array having the same port and communication processor labels as the port and communication processor to which it is connected in the relevant phantom copy. The resulting routing diagram would be a hexagonal array having E entries on each side. Each communication processor would be within E-1 communication processors of each other communication processor in the hexagonal array. It may be shown (see Schlumberger Palo Alto Research Report #47) that this is the minimum possible distance between communication processors. Hence the present invention is the most efficient communication network in terms of the number of times a message must be retransmitted to reach its final destination.

In addition to minimizing the distance between any two communication processors in a single hexagonal array, the signal paths and routing switches provide improved performance in larger networks constructed by combining several hexagonal arrays as shown in FIGS. 3(a) and 3(b). In such networks, the routing switches are used to make the connections between the individual hexagonal arrays. When a message must be sent between communication processors which are located in different hexagonal arrays which are separated by one or more additional hexagonal arrays, the signal paths may be used to "jump" the message around the intervening hexagonal arrays.

For example, consider a message which is to be sent from the communication processor labeled 37 in FIG. 3(a) to the communication processor labeled 35. Without the external signal paths, the message would have to be passed from communication processor to communication processor until it reached the edge of the hexagonal array in which communication processor 37 is located. It would then have to be passed in a similar manner across the hexagonal array containing communication processor 32 until it reached the edge of said hexagonal array. Finally, it would be passed to communication processor 35 through the appropriate communication processors in the hexagonal array in which it is located. The routing switches on the edge of the hexagonal arrays allow the message to be relayed from a communication processor on the edge of the hexagonal array containing communication processor 32 to a communication processor on the opposite edge of said hexagonal array, thus bypassing all the communication processors in the hexagonal array containing communication processor 32. This greatly reduces the transmission time for messages whose destination is far from their source.

As pointed out above, it is important that a communication processor not contain global information which must be stored in a table whose size depends on the size of the hexagonal array. This is because, if such a table is required, the maximum size of the hexagonal array that can be constructed will depend on the available space in this table. The routing diagram described above is such a table. The present invention also provides a solution to this problem.

To avoid allocating excessive space for such a table, the present invention uses a labeling scheme for the communication processors which allows the information contained in said routing diagram to be reduced to an algorithm whose storage requirements are independent of the size of the hexagonal array. Hence, a communication processor according to the present invention can be used in a communication network of any size, where the network is connected as a hexagonal array.

The labeling scheme used in the present invention is illustrated in FIG. 8(a). A portion of an "infinite" hexagonal array is shown at 91'. Each communication processor is assigned a label which consists of two numbers, (x,y), which specify the location of each communication processor in a coordinate system which is analogous to coordinates in a Cartesian coordinate system. These two numbers are shown in each hexagon separated by a comma. The axes of this coordinate system are shown at 92. The coordinate system differs from a Cartesian coordinate system in that the axes are not orthogonal and in that a third axis, labeled D, is defined. As one moves from communication processor to communication processor in a direction parallel to the x-axis, the first coordinate is incremented or decremented, depending on the direction of travel. Similarly, as one moves from communication processor to communication processor in a direction parallel to the y-axis, the second coordinate is incremented or decremented. Finally, as one moves parallel to the D-axis, both the first and second coordinates are incremented or decremented. It should be noted that each axis corresponds to two ports. For example, a message sent from port 1 or port 4 will be propagated in a direction parallel to the D axis. The ports are numbered as shown at 93 in FIG. 8(b).

Using this labeling scheme, a communication processor can compute the optimum path to any other communication processor without the need for a routing diagram. For the purposes of this discussion, the communication processor which is sending a message will be referred to as the sender, and the communication processor which is to be the final destination of said message will be referred to as the receiver. The sender first computes the angle of the line relative to the x-axis which joins the sender to the receiver. This angle is referred to as the receiver angle. Each port is assigned a "part angle" angle which is equal to the angle of the line connecting the sender to the communication processor adjacent to the sender which is connected to said port. The port angles are also calculated relative to the x-axis. Hence, the port angle of port 1 is 60 degrees, the port angle of port 2 is 120 degrees, and so on. A list of the ports in order of preference is then computed by ordering the ports using the absolute value of the difference of the receiver angle and each port angle.

For example, consider a message which is to be sent from the communication processor at (0,0) to the communication processor at (1,2). The receiver angle (the angle of the line joining center of the communication processor at (0,0) to center of the communication processor at (1,2)) is 90 degrees. Hence ports 1 and 2 are preferred, since they each have port angles which differ from the receiver angle by 30 degrees. Ports 6 and 3 are the next most preferred ports, since they each have port angles which differ from the receiver angle by 90 degrees, and so on.

If the receiver were at (0,2) in the above example, the receiver angle would be 120 degrees and only one port, port 2, would be preferred. The next most preferred ports would be ports 1 and 3 in this case, and so on.

The above described routing algorithm may be applied to a finite hexagonal array communication network according to the present invention. A communication network according to the present invention based on a hexagonal array having three communication processors on each side is shown at 94 in FIG. 9. The boundaries of the hexagonal array are delineated by bold lines. The relevant portions of the six phantom copies of the hexagonal array are shown outside these lines. As pointed out with reference to FIG. 6 above, these phantom copies are used to simplify the calculation of the optimum routing when the signal paths joining opposite edges of the hexagonal array 94 are used for routing a message. These phantom copies allow each communication processor to compute the coordinates of any other communication processor in the hexagonal array.

These signal paths introduce discontinuities into the coordinate system described above. For example, as one proceeds along the positive y-axis from (0,0), the next communication processor encountered after the communication processor at (0,2) is the communication processor at (−2,−2), not a communication processor at (0,3) as would be the case in an "infinite" hexagonal array. Hence, each communication processor must store a number specifying the size of the hexagonal array, so that the position of this discontinuity and the coordinates of the next communication processor beyond the discontinuity may be calculated.

A second difference between the finite hexagonal array and the infinite hexagonal array is that a given communication processor may be reached by traveling along a number of different directions. For example, the communication processor at (−2,−2) may be reached from the communication processor at (0,0) by proceeding along the positive y-axis, by proceeding along the negative D-axis or by proceeding along the positive D-axis to the communication processor at (1,1) and then along the line parallel to the positive X-axis. The correct path is chosen as follows. The sender computes the coordinates of the receiver which is within E-1 communication processors of the sender, where E is the number of communication processors on a side of the hexagonal array 94. As noted above, the signal paths connecting communication processors on the edge of the hexagonal array 94 are chosen such that every communication processor is within E-1 communication processors of every other communication processor. The receiver's coordinates will only appear once within a distance of E-1 communication processors from the sender.

With the above modifications, the sender can assign a list of ports, in order of preference, to be used to send a message to any receiver in the hexagonal array using the algorithm described with reference to an infinite hexagonal array. The sender calculates the location of the communication processor having the coordinates of the receiver which is within E-1 communication processors of the sender. To do this, it calculates the position of each communication processor in the hexagonal array or in the six virtual copies thereof which has the same coordinates as the receiver. It then selects the communication processor whose position is within E-1 communication processors of the sender. The sender then computes the angle of the line joining this communication processor to the sender and computes a list of ports, in order of preference, to be used in sending the message. The message is then sent to the adjacent communication processor connected to the port of highest preference. If there are two such ports, then the message is sent by the first such port which is free. If this adjacent communication processor is unavailable, e.g., busy on another task or inoperative, the next highest preference port is used, and so on until the message is successfully transmitted to an adjacent communication processor.

Figure 10:
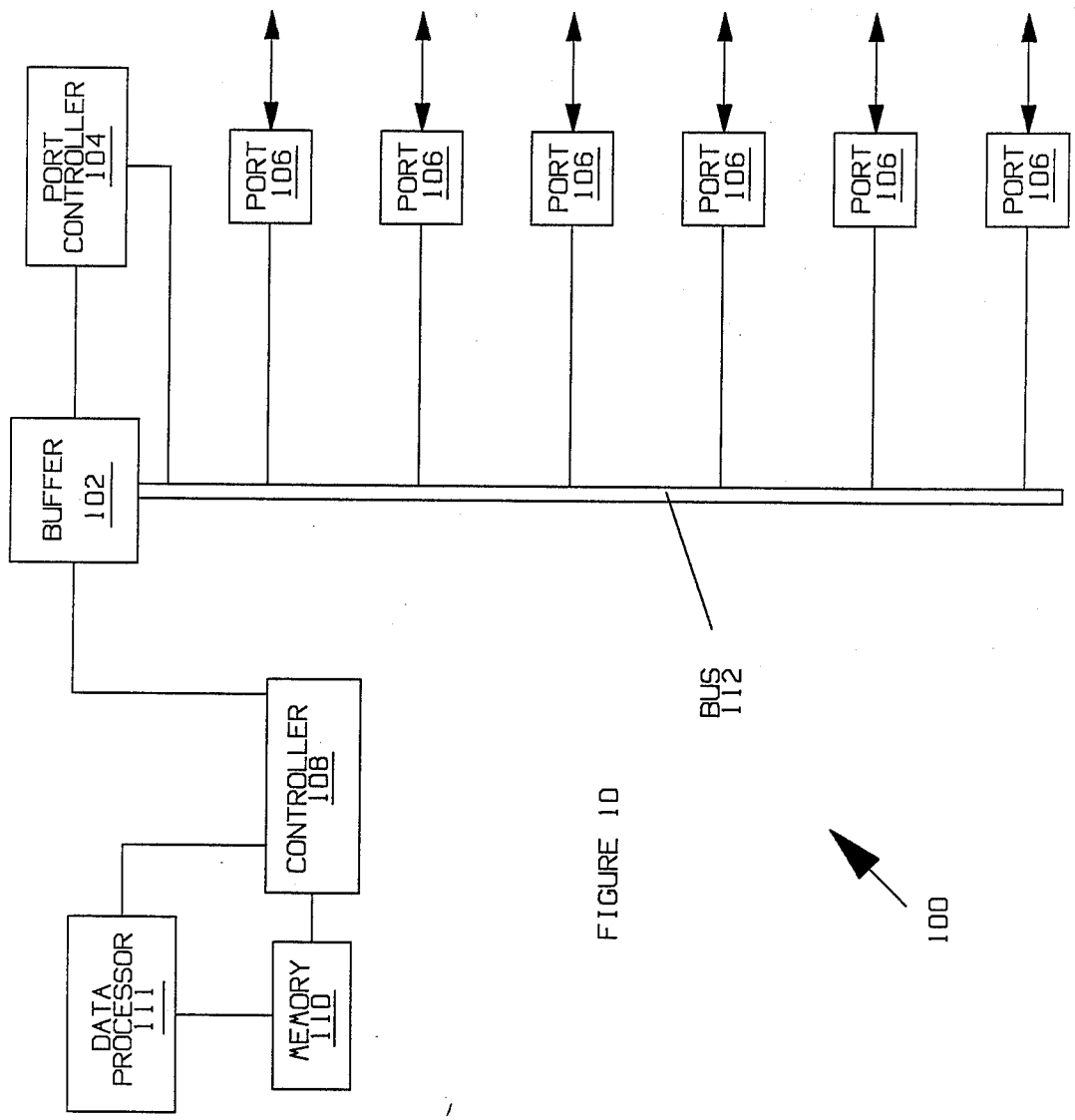
FIG. 10 is a block diagram of a communication processor used in the preferred embodiment of the present invention.

The preferred embodiment of a communication processor according to the present invention is shown at 100 in FIG. 10. It has four basic elements. The first element is a buffer 102 which is used to store messages which pass through the communication processor. The second element is a port controller 104 which supervises the transmission of messages through the third basic element, the ports 106. The fourth basic element is a direct memory access controller 108 which supervises the transfer of messages between the buffer 102 and the memory 110 of the data processor 111 connected to the communication processor in question.

To better utilize space in the buffer 102, long messages are divided into a plurality of small messages which are referred to as packets. The division of a long message into a series of packets is carried out by the direct memory access controller 108, as will be described in more detail below. Each packet contains a header which identifies the message to which it belongs and the final destination of the packet. The header also contains the number of packets in the message and the position of the packet in question in said message. Finally, the header also includes error checking information used by the ports 106 to verify that a message has been properly sent and received.

The buffer 102 is divided into a plurality of storage slots. Each storage slot is used to store one packet. In the preferred embodiment, the size of a packet is chosen to be the length of the average message sent in the data processing system. A packet stored in the buffer 102 may be transferred to a port 106 over a bus 112 which is shared by the six ports 106 and the direct memory access controller 108. Conflicts over the use of the bus 112 are resolved by a buffer controller which is part of the buffer 102. The priority of the various operations carried out by the communication processor will be discussed in more detail below.

Since the bus 112 must service all six ports 106 and the direct memory access controller 108, the time needed to transfer a packet from the buffer 102 to a given port 106 or to the direct memory access controller must be small compared to the time needed to output a packet on a given port 106. If this is not the case, a packet may have to wait in the buffer 102 even when the port 106 to which it is destined is free. In the preferred embodiment, the width of the bus 112 is large enough to transfer a packet in two bus cycles. This is about one tenth the time needed to output the packet through a port 106. Each of the ports 106 contains an internal buffer which is sufficient to store one packet. Hence each port 106 can operate independently of the buffer 102 and the other ports 106. When a port 106 is used to transfer a packet from the buffer 102 to an adjacent communication processor, it transfers the packet from the buffer 102 and stores said packet in its internal buffer. The port 106 then transmits the packet independently of other operations in the communication processor. Similarly, when a port 106 is to receive a packet from an adjacent communication processor, said port accumulates the packet in its internal buffer.

As mentioned above, the buffer 102 contains a controller which is responsible for the allocation of storage space in the buffer. When a port 106 has received a packet which is be stored in the buffer 102, it requests buffer space from the buffer controller. Similarly, when a packet has been successfully transmitted to an adjacent communication processor, the port controller 104 signals the buffer controller which then makes the space occupied by the packet in question available.

Figure 11:
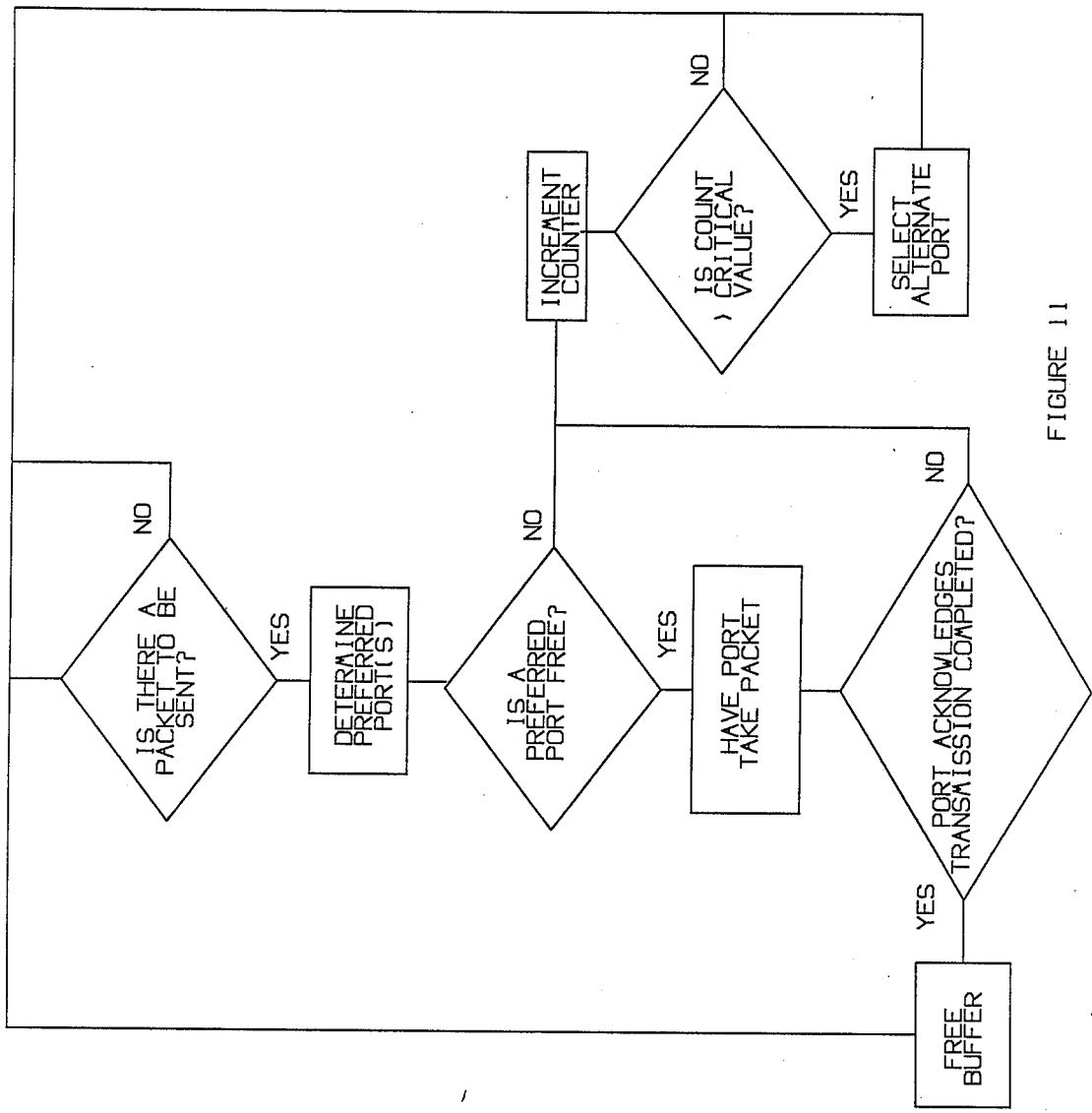
FIG. 11 is a flow chart for the operations sent.

A flow chart for the operations carried out by the port controller 104 is shown in FIG. 11. The port controller 104 cycles through the packets in the buffer 102 until it finds a packet which is ready to be sent. The port controller then determines the preferred port or ports for sending the packet. As pointed out above, if the final destination of the packet is a data processor whose communication processor does not lie on a line parallel to one of the axes, there will be more than one optimum route to said communication processor. That is, the packet may be sent from more than one port without introducing a delay. If there is more than one optimal port, the port controller assigns the packet to the first such port which is free. If one of the preferred ports 106 is free, it signals the port in question to take the packet. If neither of the preferred ports is free, a counter is incremented and tested against a critical value. If the count in said counter is greater than the critical value, the port controller selects an alternate port for the packet in question. The count in said counter is a measure of the "staleness" of the packet in question, since it measures the number of times the packet was refused transmission. The port controller 104 then returns to cycling though the packets in the buffer 102 until it finds the next packet which is to be sent.

If the port 106 to which the packet was assigned successfully completes the transmission of the packet, it signals the port controller 104. The port controller 104 then signals the buffer controller which frees the space previously occupied by said packet. If the port 106 in question reports a failure in transmitting the packet, the counter associated with the packet in question is incremented and tested as described above.

When an alternate port must be chosen, three factors influence the choice of which of these ports should be used. First, if the packet originated in another communication processor (i.e., the communication processor in question is merely relaying the packet towards its final destination), the packet should not be sent out the same port over which it was received. If this rule is not followed, the packet may be passed back and forth between the same two communication processors until a more optimum routing becomes available. This is referred to as "thrashing". In addition to delaying the movement of the packet to its destination, thrashing increases the communication load on the two communication processors between which the packet is passed. Information specifying the port 106 over which the packet was received is stored with the packet in the buffer 102. This information is provided by the port 106 which received the packet in question. Thus the port controller has the necessary information to avoid this problem.

Second, in large hexagonal arrays (greater than 3 communication processors on a side), there are numerous routes over which packets bound for a distant communication processor may be sent. The port 106 chosen for sending the packet affects the number of available routing decisions for later transfers. This may best be explained with reference to the following example.

Referring to FIG. 8(a), consider a packet leaving the communication processor labeled $(1, -2)$ whose final destination is the data processor connected to the communication processor at $(2,2)$. There are four optimum routes to $(2,2)$, each requiring that the packet be transmitted four times. The first such route passes through communication processors at $(1, -1)$, $(1,0)$, and $(1,1)$. The second route passes through the communication processors at $(1, -1)$, $(1,0)$, and $(2,1)$. The third route passes through the communication processors at $(1, -1)$, $(2,0)$, and $(2,1)$, and the fourth route passes through the communication processors at $(2, -1)$, $(2,0)$, and $(2,1)$. Since there are three optimum routes possible if the packet is sent via the communication processor at $(1, -1)$, port 2 which connects the communication processor in question to the communication processor at $(1, -1)$ is preferred over port 1 which connects the communication processor in question to the communication processor at $(2, -1)$. Port 2 allows a greater degree of routing flexibility in subsequent routing decisions.

In the preferred embodiment of the present invention, this "flexibility" information is used both in the determination of the optimum port over which the packet is to be sent and in the determination of an alternate port if the optimum port is unavailable. The angle computation algorithm described above automatically takes this information into account. In the above example, the difference in the the angle between the line joining the communication processor at $(1, -2)$ to the communication processor at $(2,2)$ and angle of the line through port 2 parallel to the y axis is less than the difference between the angle of said line and the angle of the line through port 1 parallel to the D axis. Hence, port 2 would automatically be chosen.

Finally, the availability of the alternate ports must be taken into consideration. Consider a case in which there are two alternate ports with the same path length, but different "flexibilities". If the port having the greater flexibility is busy, the other port is chosen. The critical value of the counter which measures the "staleness" of the packet (i.e., the number of times the packet has been refused transmission) represents a time which is greater than the time needed to retransmit the packet once on average. Hence it is better to send the packet via a slightly inferior route than to wait for the slightly better route.

It will be apparent to those skilled in the art that other routing algorithms requiring less complexity are possible. For example, the port controller could merely assign the packet to a randomly selected alternative port which is not the one over which the packet was received. This port could be chosen from those ports which do not involve sending the packet in a direction which puts it further from its final destination. Although such a random assignment algorithm is less efficient, it requires less hardware to implement and hence may be preferable for economic reasons.

Figure 12:
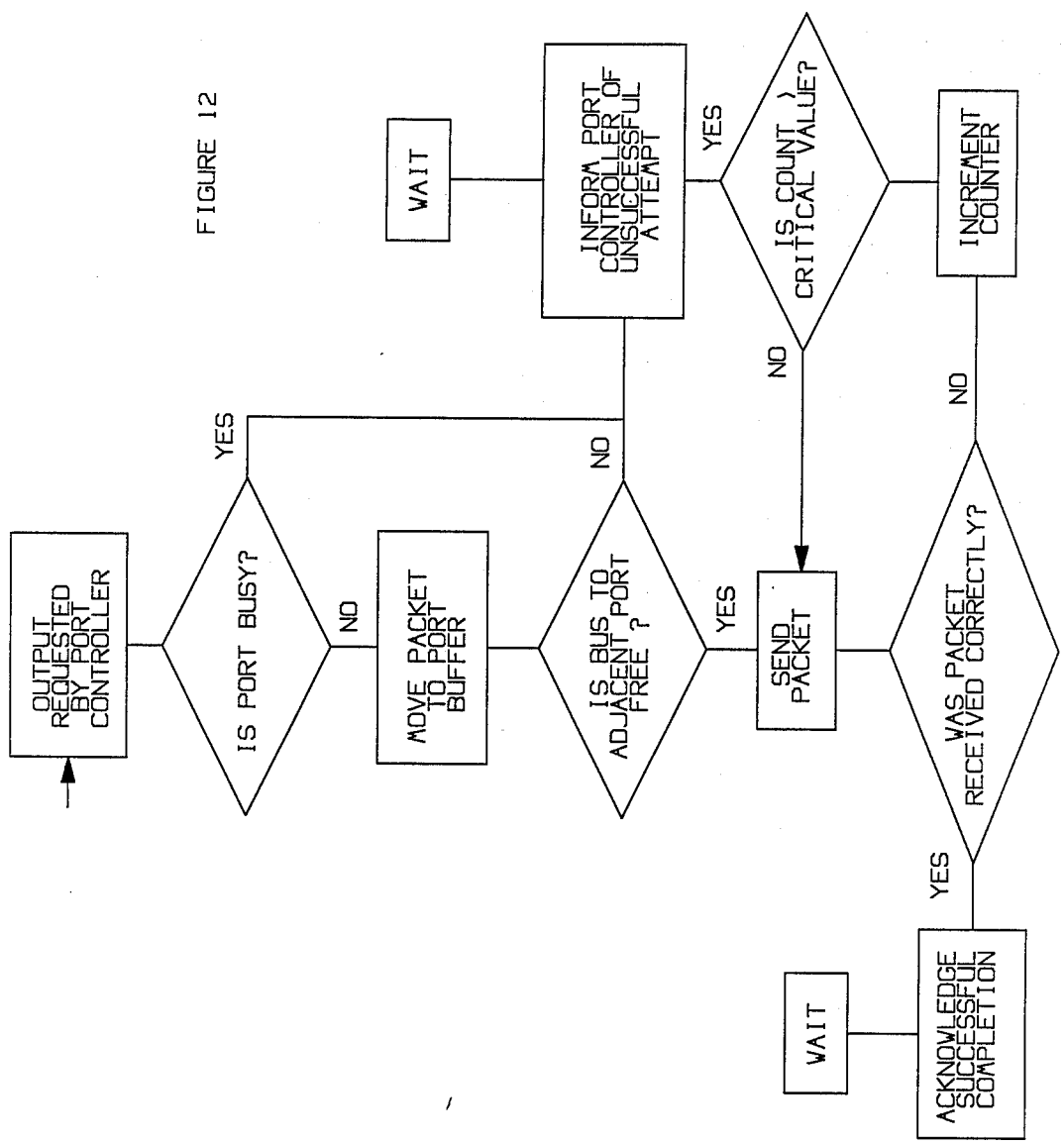
FIG. 12 is a flow chart for the operations carried out by a port controller when a packet is sent.

A flow chart for operations carried out by a port 106 when the port controller requests it to transmit a packet is shown in FIG. 12. When the port 106 receives a request to transfer a packet and it is busy, it sends a signal to the port controller 104 which is the same as the signal sent for an unsuccessful attempt to send a packet. If the port 106 in question is free, it signals the buffer controller which transfers the packet to the buffer in the port 106 in question. The port 106 then attempts to establish a communication link with the corresponding port 106 in the adjacent communication processor to which it is connected. If it fails, it signals the port controller 104. If it succeeds, it transmits the packet in question and waits for the receiving port 106 to signal that the packet was correctly received. If it was not correctly received, the port 106 in question increments a counter. If the count in said counter is less than a predetermined critical value, it sends the packet in question again. If said count is greater than said critical value, it signals the port controller 104 that it failed to complete the transmission. If the receiving port 106 acknowledges a successful transmission, the port 106 in question signals the port controller 104 that the packet was successfully sent. It then enters a wait state.

Figure 13:
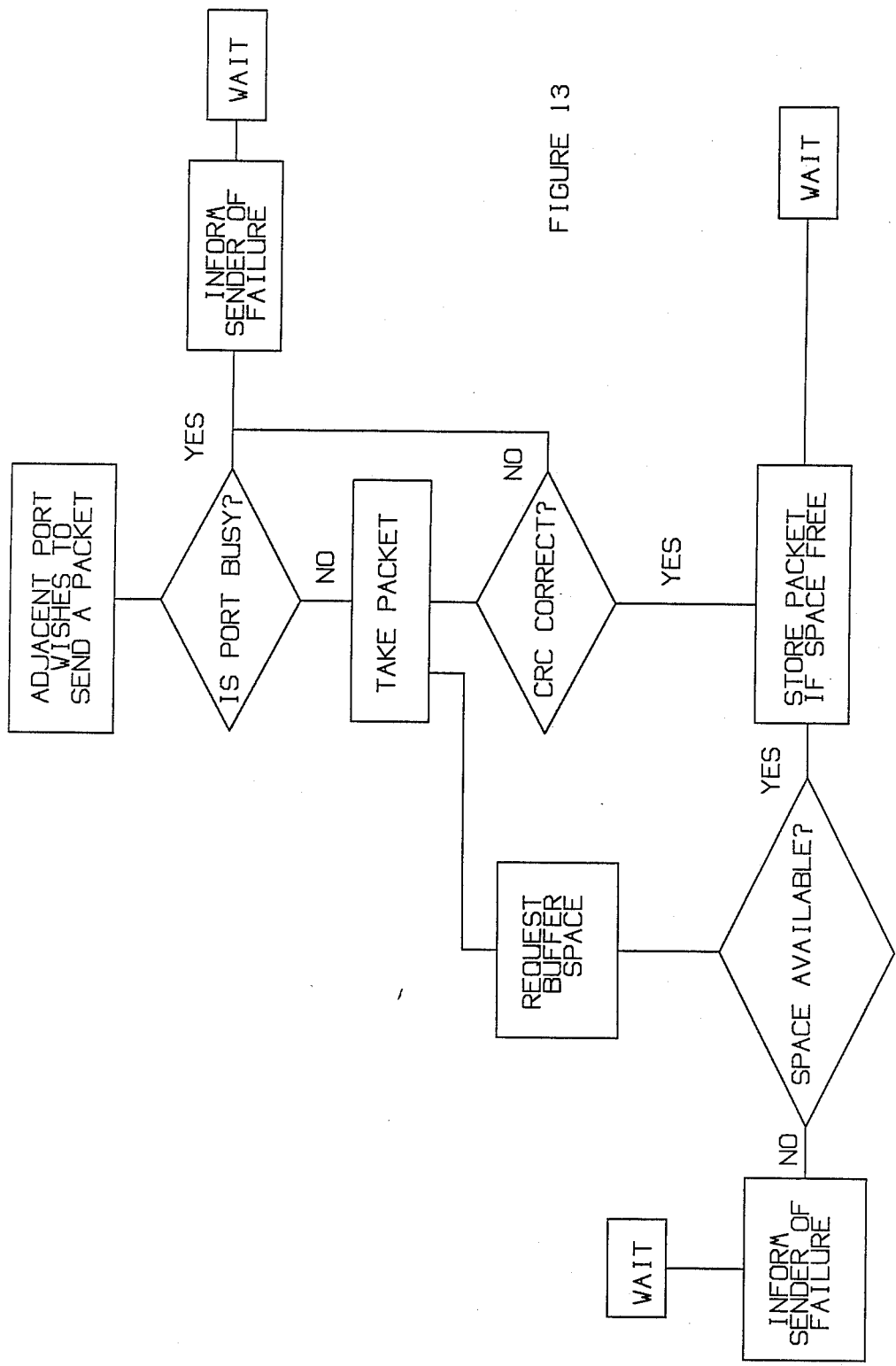
FIG. 13 is a flow chart for the operations carried out by a port controller when a packet is to be received.

A flow chart of the operations performed by a port 106 when an adjacent communication processor wishes to send it a packet is shown in FIG. 13. If the port 106 in question is busy when it receives the request, it signals the sending port. This situation can arise when the port in question has not yet transferred a previously received packet from its buffer to the buffer 102. If the port 106 in question is free, it takes the packet in question. At the same time, it requests buffer space from the buffer controller in the buffer 102. Upon completion of the transmission, the port in question tests the packet for correct transmission using a conventional cyclic redundancy check. If the packet was not correctly transmitted, it signals the sending port. If the packet was successfully transmitted and space was available in the buffer 102, it transfers the packet to the buffer 102 to be stored at the location assigned by the buffer controller. If space was not available, it signals the sending port that the transmission failed.

The direct memory access controller 108 cycles through the packets stored in the buffer 102 until it finds the stored packet which has been waiting the longest for further processing and which has the communication processor in question as its final destination. It examines the header information in the packet to determine whether the message from which this packet was derived required more than one packet. If only one packet was used, the direct memory access controller 108 stores the message part of the packet in the memory of the data processor and signals the data processor that a message has arrived.

The direct memory access controller 108 includes a table which is used to reassemble messages that were divided into more that one packet. If the message in question had more than one packet, the direct memory access controller 108 consults this table to determine if this is the first packet to be received from that message. If it is the first packet, the direct memory access controller 108 starts an entry for this message in the table and allocates sufficient space in the memory of the data processor to store the entire message. The direct memory access controller 108 then stores the packet in question at the appropriate location in the memory block reserved for this message in the data processor's memory. It then searches for other packets in the buffer 102. If the packet in question is not the first packet of the message, the direct memory access controller 108 makes an entry in the table indicating that this packet has been received and then stores it at the appropriate location in the memory of the data processor. If the packet in question was the last remaining packet needed to complete the message, the direct memory access controller 108 erases the table and signals the data processor that a message has been received.

When the data processor has a message to send, it signals the direct memory access controller 108, giving the location of the message in the data processor memory 110. The direct memory access controller 108 then fetches the message, assigns appropriate header information to the message, and divides it into packets. The packets are then stored in the buffer 102. A unique message label is included in the header information to enable the receiving communication processor to distinguish the packets of this message from packets from other messages. For example, this label may consist of the identity of the communication processor sending the message and a sequence number which is incremented each time a message is sent by said communication processor.

The priorities of the various tasks carried out by the communication processor and the allocation of space in the buffer 102 are chosen so as to minimize the possibility of a bottleneck. The six ports 106 and the direct memory access controller 108 all share the same buffer 102 from which packets are retrieved for transmission and stored on arrival. This shared buffer minimizes the number of internal busses and wires and reduces the amount of buffer space needed in each communication processor. However, this architecture also results in potential problems of contention for the buffer as a shared resource.

There are three general traffic patterns and two possible deadlock scenarios for packet transmission in the communication processor. Deadlock will occur if all of the buffer space becomes filled with messages which cannot be delivered because the adjacent communication processors are all too busy to accept packets. Traffic patterns consist of outbound packets from the local data processor connected to the communication processor in question to a remote communication processor, inbound packets from a remote communication processor whose destination is the data processor connected to the communication processor in question, and inter-communication processor traffic consisting of packets originating in a remote communication processor which are being relayed by the communication processor in question on towards their final destinations. Both outbound packets and intercommunication processor packets route packets through the ports 106. Inbound packets must also flow through the direct memory access controller 108.

The buffer allocation algorithm used in the preferred embodiment is guaranteed not to create deadlock. This is accomplished by reserving sufficient free buffer space to allow packets to circulate across the communication network without deadlock, while allocating this buffer space in a manner which will also result in efficient packet flow across the hexagonal array. In the worse case, a delay in the packet transmission occurs.

In the preferred embodiment, the buffer 102 contains space for at least four packets. Simulations of systems with buffer space for differing numbers of packets indicate that the optimum buffer storage capacity in a hexagonal array having three communication processor on a side is 19 packets. The buffer space may be used by any port 106 or the direct memory access controller 108 for traffic in any direction until there is only free space for 3 packets in the buffer 102. At this point, incoming packets from the ports 106 must be tested to assure that they will not cause a deadlock to occur. Space for one inbound packet must always be free to assure that deadlock will not occur. Any incoming packet from a port 106 which would cause deadlock is refused.

Although space for one more packet is all that is needed to prevent deadlock, the preferred embodiment reserves space for three more packets in order to increase efficiency. When there is only space for three more packets, the direct memory access controller 108 will no longer add packets to the buffer. In this case, the direct memory access controller 108 will only remove inbound packets from the buffer. If an inbound packet on one of the ports 106 is destined for the data processor connected to the communication processor in question and another packet so destined is already queued for direct memory access controller 108 transmission to the data processor, the inbound packet will be refused by the port 106. Intercommunication processor packets are accepted so long as the acceptance of said packets will leave space in the buffer 102 for one inbound packet to the data processor connected to the communication processor in question. This strategy has the effect of lowering the priority of packet "producers" and increasing the priority of packet "consumers" when the communication network becomes overloaded locally.

When packets are queued in the buffer 102 for delivery to adjacent communication processors, the port controller 104 continually attempts to reduce the number of packets in the buffer 102 by delivering them to their destination ports 106. This is done by matching the destination port 106 of each packet with an available port list. As explained above, if a desired port 106 is busy, a count is incremented for the packet in question. When the count exceeds a predetermined value, the port 106 assigned to that packet is changed to an alternate port 106 if possible. Reducing the number of queued packets has priority over accepting new packets for storage in the buffer 102. Hence the port controller 104 gives priority over the bus 112 to ports 106 which are ready to transmit a packet to an adjacent communication processor. The direct memory access controller 108 has the highest priority when it is transferring packets from the buffer to the data processor connected to the communication processor in question.

There are two possible overload situations. First, consider a situation in which the overall load on the communication processor is relatively small, but several of the ports 106 have incoming packets which are all to be retransmitted from a single port. In this case, there will be a number of packets waiting to be delivered through a single port 106, even though the overall load on the communication processor is light (only one port 106 is being heavily used). Since there are many free ports 106 linking this communication processor to other adjacent communication processors, it is advantageous to reroute the packets through alternative ports 106. The algorithm described above accomplishes this rerouting automatically, since each time a packet is examined by the port controller 104 and found to be undeliverable because its assigned port 106 is busy, a counter is incremented. When the count exceeds a predetermined value, the packet is rerouted if possible, thus transferring the work load to a lesser used port 106.

Next, consider the case in which there is heavy congestion at a number of adjacent communication processors. The buffer 102 will soon fill up with packets destined for all of the six ports 106. Those packets which can be rerouted to the less heavily used ports 106 will be so rerouted. This again results in a more even packet load as in the light load situation; however it will add a further delay in packet transmission. Finally, as described above relating to the prevention of deadlock, the production of new packets in the congested area will be reduced to relieve the congestion.

Various modifications will be apparent to those skilled in the art without departing from the present invention as claimed.

What is claimed is:

1. In a data processing system including a plurality of data processors, each said data processor including memory means for storing messages to be sent to or received from other data processors in said data processing system, a communication network for sending messages between any two data processors in said data processing system comprising:

a hexagonal array of communication processors, having E communication processors on each side of said hexagonal array, each said communication processor being operatively connected to a said data processor, each said communication processor comprising:

means for exchanging messages with the data processor coupled to said communication processor; and port means for communicating with the adjacent said communication processors, each said communication comprising sending a message to or receiving a message from a communication processor adjacent to said communication processor in said hexagonal array, said port means being adapted for simultaneous asynchronous communication with the six communication processors adjacent to said communication processor, said port means including six discrete ports, each said port in said port means being operatively connected to a corresponding port of a different one of a plurality of communication processors where such other communication processors are adjacent to said communication processor, said port means further comprising means for selecting a said discrete port for transmitting said message, said port being selected with reference to the final destination of said message in said hexagonal array.

2. The communication network of claim 1 wherein each said port further comprises:

means for determining if the corresponding port to which it is coupled is capable of receiving a message;

means for determining if a message sent to the corresponding port was correctly transmitted;

means for repeating said message if said message was not correctly transmitted;

means for signaling the corresponding port that said port is capable of receiving a message;

means for determining if a message received by said port from the corresponding port was correctly transmitted; and means for causing the corresponding port to repeat the last message sent by said corresponding port.

3. The communication network of claim 1 wherein said communication processor further comprises:

buffer means for storing messages;

means for specifying a port destination for each message stored in said buffer means, said port destination being either the data processor to which said communication processor is operatively connected or a port through which said message is to be sent;

direct memory access control means for transferring messages between the memory means of the data processor operatively connected to said communication processor and said buffer means; and control means for causing a message stored in said buffer means to be coupled to the port specified by said port destination specifying means, and for causing a message received by one of said ports to be stored in said buffer means.

4. The communication network of claim 3 wherein said buffer means comprises a plurality of storage slots, and wherein said messages include long messages which are too long to be stored in a single storage slot and wherein said direct memory access control means further comprises:

means for creating a plurality of shorter messages from a long message by dividing said long message into a plurality of shorter messages of a size enabling the storage of each shorter message in a corresponding storage slot, each said shorter message including information specifying the long message from which it was created and its relationship to the other shorter messages created from said long message; and means for recombining the shorter messages generated by the division of a long message such that said long message is reconstructed.

5. In a data processing system including a plurality of data processors, each said data processor including memory means for storing messages to be sent to or received from other data processors in said data processing system, a communication network for sending messages between any two data processors in said data processing system comprising:

a hexagonal array of communication processors, having E communication processors on each side of said hexagonal array, each said communication processor being operatively connected to a said data processor, each said communication processor comprising:

means for exchanging messages with the data processor coupled to said communication processor;

port means for communicating with the adjacent said communication processors, each said communication comprising sending a message to or receiving a message from a communication processor adjacent to said communication processor in said hexagonal array, said port means being adapted for simultaneous asynchronous communication with the six communication processors adjacent to said communication processor, said port means including six discrete ports, each said port in said port means being operatively connected to a corresponding port of a different one of a plurality of communication processors where such other communication processors are adjacent to said communication processor; and signal path means for coupling the ports of each communication processor on the edge of said hexagonal array which are not coupled to a corresponding port of an adjacent communication processor to a corresponding port of a communication processor on the opposite edge of said hexagonal array such that a message may be sent from any communication processor in said hexagonal array to any other communication processor in said hexagonal array without passing through more than E-2 other communication processors in said hexagonal array.

6. The communication network of claim 5 wherein each said signal path means further comprises:

switch means operatively connected to at least one said edge port, said switch means including means for selectively coupling said edge port to a data processor external to said hexagonal array.

7. In a data processing system including a plurality of data processors, each said data processor including memory means for storing messages to be sent to or received from other data processors in said data processing system, a communication network for sending messages between any two data processors in said data processing system comprising:

a hexagonal array of communication processors, having E communication processors on each side of said hexagonal array, each said communication processor being operatively connected to a said data processor, each said communication processor comprising:

means for exchanging messages with the data processor coupled to said communication processor; and port means for sending messages to and receiving messages from communication processors which are adjacent to said communication processors in said hexagonal array, said port means including six discrete ports, each said port in said port means being operatively connected to a corresponding port of a different one of a plurality communication processors where such other communication processors are adjacent to said communication processor, wherein said communication processor further comprising:

buffer means for storing messages;

means for specifying a port destination for each message stored in said buffer means, said port destination being either the data processor to which said communication processor is operatively connected or a port through which said message is to be sent;

direct memory access control means for transferring messages between the memory means of the data processor operatively connected to said communication processor and said buffer means; and control means for causing a message stored in said buffer means to be coupled to the port specified by said port destination specifying means, and for causing a message received by one of said ports to be stored in said buffer means and wherein said control means further comprises:

means for sequentially examining each message stored in said buffer means having a port destination which is a port;

means, for ascertaining whether the communication processor coupled to said port is capable of receiving said message; and means for causing said message to be coupled to said port from said buffer means if the communication processor to which said port is coupled is capable of receiving said message;

means for counting the number of times said message could not be sent because the communication processor coupled to said port was not capable of receiving a message; and means for causing said port destination specifying means to specify a different port destination for said message if said counting means indicates that said message could not be sent more than a predetermined number of times.

8. In a data processing system having a plurality of data processors, each said data processor including memory means for storing messages to be sent to or received from other data processors in said data processing system and being operatively connected to a communication processor which is contained in a hexagonal array of communication processors, a communication processor comprising:

means for exchanging messages with the data processor coupled to said communication processor; and port means for communicating with the adjacent said communication processors, each said communication comprising sending a message to or receiving a message from a said communication processor adjacent to said communication processor in said hexagonal array, said port means being adapted for simultaneous asynchronous communication with the six communication processors adjacent to said communication processor, said port means including six discrete ports, each said port in said port means being operatively connected to a corresponding port of a different one of a plurality of communication processors where such other communication processors are adjacent to said communication processor, said port means further comprising means for selecting a said discrete port for transmitting said message, said port being selected with reference to the final destination of said message in said hexagonal array.

9. The communication processor of claim 8 wherein each said port further comprises:

means for determining if the corresponding port to which said port is coupled is capable of receiving a message;

means for determining if a message sent to the corresponding port was correctly transmitted;

means for repeating said message if said message was not correctly transmitted;

means for signaling the corresponding port that said port is capable of receiving a message;

means for determining if a message received by said port from the corresponding port was correctly transmitted; and means for causing the corresponding port to repeat the last message sent by said corresponding port.

10. The communication processor of claim 9 further comprising:

buffer means for storing messages;

means for specifying a port destination for each message stored in said buffer means, said port destination being either the data processor to which said communication processor is operatively connected or a port through which said message is to be sent;

direct memory access control means for transferring messages between said memory means of the data processor operatively connected to said communication processor and said buffer means; and control means for causing a message stored in said buffer means to be coupled to the port specified by said port destination specifying means, and for causing a message received by one of said ports to be stored in said buffer means.

11. The communication processor of claim 10 wherein said buffer means comprises a plurality of storage slots, and wherein said messages include long messages which are too long to be stored in a single storage slot and wherein said direct memory access control means further comprises:

means for creating a plurality of shorter messages from a long message by dividing said long message into a plurality of shorter messages of a size enabling the storage of each shorter message in a corresponding storage slot, each said shorter message including information specifying the long message from which it was created and its relationship to the other shorter messages created from said long message; and means for recombining the shorter messages generated by the division of a long message such that said long message is reconstructed.

12. In a data processing system having a plurality of data processors, each said data processor including memory means for storing messages to be sent to or received from other data processors in said data processing system and being operatively connected to a communication processor which is contained in a hexagonal array of communication processors, a communication processor comprising:

means for exchanging messages with the data processor coupled to said communication processor; and port means for sending messages to and receiving messages from communication processors which are adjacent to said communication processor in said hexagonal array, said port means including six discrete ports, each said port in said port means being operatively connected to a corresponding port of a different one of a plurality of communication processors where such other communication processors are adjacent to said communication processor, wherein each said port further comprises:

means for determining if the corresponding port to which said port is coupled is capable of receiving a message;

means for determining if a message sent to the corresponding port was correctly transmitted;

means for repeating said message if said message was not correctly transmitted;

means for signaling the corresponding port that said port is capable of receiving a message;

means for determining if a message received by said port from the corresponding port was correctly transmitted; and means for causing the corresponding port to repeat the last message sent by said corresponding port, wherein said communication processor further comprising:

buffer means for storing messages;

means for specifying a port destination for each message stored in said buffer means, said port destination being either the data processor to which said communication processor is operatively connected or a port through which said message is to be sent;

direct memory access control means for transferring messages between said memory means of the data processor operatively connected to said communication processor and said buffer means; and control means for causing a message stored in said buffer means to be coupled to the port specified by said port destination specifying means, and for causing a message received by one of said ports to be stored in said buffer means, and wherein said control means further comprises:

means for sequentially examining each message stored in said buffer means having a port destination which is a port;

means for ascertaining whether the communication processor coupled to said port is capable of receiving said message; and means for causing said message to be coupled to said port from said buffer means if the communication processor to which said port is coupled is capable of receiving said message;

means for counting the number of times said message could not be sent because the communication processor coupled to said port was not capable of receiving a message; and means for causing said port destination specifying means to specify a different port destination for said message if said counting means indicates that said message could not be sent more than a predetermined number of times.

* * * * *

UNITED STATES PATENT AND TRADEMARK OFFICE
CERTIFICATE OF CORRECTION

PATENT NO. : 4,922,408

DATED : May 1, 1990

INVENTOR(S) : Alan L. Davis

It is certified that error appears in the above-identified patent and that said Letters Patent is hereby corrected as shown below:

```
     Col. 5, line 36,   after "8(a) " insert --to --.
     Col. 5, line 42,   after "operations " insert
--carried out by the port controller when a packet is --.
     Col. 6, line 21,   after "messages " insert
--may--.
     Col. 7, lines 53-54, replace "considerations by
the" by --considerations: the--.
     Col. 12, line 68,  replace " "part angle" angle "
by -- "port angle" --.
     Col. 20, lines 11-12, replace "rer-outing " by
--re-routing --.

. Col. 3, lines 50-51, replace "multi-proceesor"
by --multi-processor --.
     Col. 4, line 44,   after "of" insert --the --.
     Col. 5, line 44,   delete "controller".
     Col. 5, line 46,   delete "controller ".
     Col. 8, line 24,   replace "if" by --If --.
     Col. 15, line 56,  replace "though" by
--through --.
     Col. 18, line 28,  replace "processor" by
--processor's --.
     Col. 19, line 17,  replace "processor" by
--processors --.
     Col. 22, lines 54-55, replace "comprising:" by
--comprises: --.
     Col. 23, line 2,   after "means" insert --,--.
     Col. 23, line 7,   delete "," after "means".
```

UNITED STATES PATENT AND TRADEMARK OFFICE
CERTIFICATE OF CORRECTION

PATENT NO. : 4,922,408

DATED : May 1, 1990

INVENTOR(S) : Alan L. Davis

It is certified that error appears in the above-identified patent and that said Letters Patent is hereby corrected as shown below:

Col. 25, lines 3-4, replace "comprising:" by --comprises: --.

Signed and Sealed this

Thirtieth Day of June, 1992

Attest:

DOUGLAS B. COMER

*Attesting Officer*   *Acting Commissioner of Patents and Trademarks*